(12) United States Patent
Ichikawa et al.

(10) Patent No.: US 6,175,150 B1
(45) Date of Patent: Jan. 16, 2001

(54) PLASTIC-ENCAPSULATED SEMICONDUCTOR DEVICE AND FABRICATION METHOD THEREOF

(75) Inventors: Seiji Ichikawa; Takeshi Umemoto; Toshiaki Nishibe; Kazunari Sato; Kunihiko Tubota; Masato Suga; Yoshikazu Nishimura; Keita Okahira; Tatsuya Miya; Tooru Kitakoga; Kazuhiro Tahara, all of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/061,904

(22) Filed: Apr. 17, 1998

(30) Foreign Application Priority Data

Apr. 17, 1997 (JP) .................................................. 9-100328

(51) Int. Cl.[7] .............................................. H01L 23/495
(52) U.S. Cl. .......................... 257/676; 257/675; 257/692; 257/720; 257/666; 361/710; 361/707; 361/709
(58) Field of Search ...................................... 257/666, 686, 257/656, 692, 711, 720, 670, 676, 796, 675; 361/710, 707, 709

(56) References Cited

U.S. PATENT DOCUMENTS

| | | | | |
|---|---|---|---|---|
| 4,132,856 | * | 1/1979 | Hutchison et al. | 257/675 |
| 5,291,178 | * | 3/1994 | Strief et al. | 338/226 |
| 5,445,995 | * | 8/1995 | Casati et al. | 437/211 |
| 5,479,050 | * | 12/1995 | Pritchard et al. | 257/670 |
| 5,519,251 | * | 5/1996 | Sato et al. | 257/666 |
| 5,723,899 | * | 3/1998 | Shin | 257/666 |
| 5,909,053 | * | 6/1999 | Fukase et al. | 257/666 |

FOREIGN PATENT DOCUMENTS

| | | |
|---|---|---|
| 58-190051 | 11/1983 | (JP) . |
| 61-144834 | 7/1986 | (JP) . |
| 10229158 | * 1/1988 | (JP) . |
| 63-15453 | * 1/1988 | (JP) . |
| 64-41253 | 2/1989 | (JP) . |
| 2-63142 | 3/1990 | (JP) . |
| 2-65355 | 5/1990 | (JP) . |
| 2-284456 | 11/1990 | (JP) . |
| 4-49647 | 2/1992 | (JP) . |
| 4-206763 | 7/1992 | (JP) . |
| 4-340755 | 11/1992 | (JP) . |
| 5-326796 | 12/1993 | (JP) . |
| 6-61400 | 3/1994 | (JP) . |
| 10-229158 | 8/1998 | (JP) . |

* cited by examiner

Primary Examiner—Minh Loan Tran
Assistant Examiner—Luan Thai
(74) Attorney, Agent, or Firm—Sughrue, Mion, Zinn, Macpeak & Seas, PLLC

(57) ABSTRACT

A plastic-encapsulated semiconductor device is provided, which is capable of efficient heat dissipation without upsizing while preventing the moisture from reaching an IC chip. This device is comprised of an electrically-conductive island having a chip-mounting area, an IC chip fixed on the chip-mounting area of the island, leads electrically connected to bonding pads of the chip through bonding wires, a plastic package for encapsulating the island, the chip, the bonding wires, and inner parts of the leads. The package has an approximately flat bottom face. Outer parts of the leads are protruded from the package and are located in approximately a same plane as the bottom face of the package. The island has an exposition part exposed from the package at a location excluding the chip-mounting area. A lower face of the exposition part of the island is located in approximately a same plane as the bottom face of the package. The chip and the chip-mounting area of the island are entirely buried in the package. Apart of the island excluding the chip-mounting area is bent toward the bottom face of the package to be exposed therefrom.

13 Claims, 26 Drawing Sheets

PLASTIC-ENCAPSULATED SEMICONDUCTOR DEVICE AND FABRICATION METHOD THEREOF

BACKGROUND OF THE INVENTION

1. Field of the Invention

The present invention relates to a semiconductor device and more particularly, to a plastic-encapsulated semiconductor device having a good heat dissipation performance and a good moisture resistance, and a fabrication method thereof.

2. Description of the Prior Art

Conventionally, plastic-encapsulated semiconductor devices have been used in various electronic equipment. In the semiconductor devices of this sort, typically, an Integrated circuit (IC) or Large-Scale Integrated circuit (LSI) chip or pellet is encapsulated in a plastic package and electrically-conductive leads or terminals are protruded from the package. These leads are electrically connected to boding pads of the IC chips within the package. If the semiconductor device is mounted on a circuit board and the leads or terminals are electrically connected to wiring lines of the circuit board, various input signals may be applied to the IC chip or pellet and various output signals may be derived therefrom.

The semiconductor devices of this sort have been practically used in various application fields. With the semiconductor devices designed for outputting the electric wave in portable or pocket telephones, electric power consumption generates a lot of heat on operation and therefore, the heat thus generated needs to be efficiently dissipated or radiated.

FIGS. 1 and 2 show a conventional plastic-encapsulated semiconductor device 501 capable of efficient heat dissipation. This device is disclosed in the Japanese Non-Examined Patent Publication No. 61-144834 published in 1986.

As shown in FIGS. 1 and 2, this plastic-encapsulated semiconductor device 501 is equipped with an approximately square IC chip or pellet 503 having bonding pads 502 on its top face. The chip 503 is mounted on an island 504. The island 504 is formed by a rectangular metallic plate and the chip 503 is fixed onto the center of an upper side of the island 504. Leads or terminals 505 are arranged at regular intervals on the long sides of the island 504. The leads 505 are electrically connected to the corresponding bonding pads 502 of the chip 503 through bonding wires 506.

The IC chip or pellet 503, the island 504, the leads 505, and the bonding wires 506 are encapsulated or molded in a rectangular parallelepiped-shaped plastic package 507 while the outer parts of the leads 505 and the short-side ends of the island 504 are protruded from the package 507. The protruding outer parts of the leads 505 are located at the long sides of the package 507. The protruding ends of the island 504 have penetrating circular holes 508.

The conventional semiconductor device shown in FIGS. 1 and 2 is mounted, for example, on an upper side of a wiring board (not shown) with the use of screws inserted into the penetrating holes 508 of the island 504. The leads or terminals 505 are electrically connected to wiring lines formed on the upper side of the wiring board. Various electric signals are transferred between the chip 503 and the wiring lines through the terminals 505. The heat generated in the chip 503 is dissipated at the protruding ends of the island 504 from the package 507.

With the conventional semiconductor device 501 shown in FIGS. 1 and 2, the heat generated in the IC chip 503 is dissipated through the island 504. However, the protruding parts of the island 4 from the package 507 are apart from the bottom of the package 507. Therefore, conventionally, to improve the heat dissipation performance or capability, a proper thermally-conductive spacer is sandwiched between the protruding ends of the island 504 and the circuit board, or a proper heat-releasing plate is fixed onto the top of the package 507. These additional members increase the number of parts and fabrication processes, thereby lowering the productivity and upsizing the semiconductor device 501.

Also, since the IC chip or pellet 503 is located at the middle of the elongated island 504, the protruding short-side ends of the island 504 are apart from the chip 503 at a comparatively long distance. Accordingly, the conventional semiconductor device 501 has no satisfactory heat-dissipation performance.

Further, although the semiconductor devices of this sort designed for the portable telephones have been required to be mounted on a wiring board as flat as possible in view of downsizing, the conventional semiconductor device 501 is not as flat as required.

FIGS. 3 and 4 show another conventional plastic-encapsulated semiconductor device 521, which solves the above-described problems in the conventional plastic-encapsulated semiconductor device 501. This device is disclosed in the Japanese Non-Examined Patent Publication No. 2-63142 published in 1990.

The explanation about the same configuration is omitted here by attaching the same reference numerals as those in FIGS. 1 and 2 to the same or corresponding elements in FIGS. 3 and 4 for the sake of simplification.

As shown in FIGS. 3 and 4, this plastic-encapsulated semiconductor device 521 is equipped with a heat-releasing plate 523 with a circular-ringed shape. The heat-releasing plate 523 is protruded from one side of a plastic package 522 from which the leads or terminals 505 are not protruded. The heat-releasing plate 523 is formed to be incorporated with an island 524.

The heat-releasing plate 523 is located on a same plane as a middle part 525 of the island 524 on which the IC chip 503 is mounted. As clearly shown in FIG. 4, the middle part 525 of the island 524 is exposed from the bottom face of the package 522. The inner parts of the leads or terminals 505, which are arranged at each side of the island 524, are also exposed from the bottom face of the package 522.

Therefore, the conventional semiconductor device 521 is able to be mounted as flat as required for the portable telephones.

The heat-releasing plate 523 has a circular penetrating hole 526. The conventional semiconductor device 521 is mounted on a wiring board (not shown) with the use of a screw inserted into the hole 526.

With the conventional semiconductor device 521 shown in FIGS. 3 and 4, since the leads or terminals 505 are exposed from the bottom face of the package 522, the leads 505 can be directly fixed onto the wiring lines of a wiring board by solder joints. The semiconductor device 521 is mounted on a wiring board by fixing the heat-releasing plate 523 protruding from the package 522 onto the wiring board with the use of a screw and fixing the island 524 onto a grounding wiring line of the wiring board.

If the middle part 525 of the island 524 is located on an electrically conductive pattern of the wiring board, the middle part 525 can be connected to the pattern by an adhesive with a good thermal conductivity. In this case, the heat generated in the IC chip 503 is efficiently transmitted to the pattern of the wiring board through the heat-releasing plate 523 and the middle part 525 of the island 524. Thus, the heat-generating chip 503 is efficiently cooled.

However, the conventional semiconductor device 521 shown in FIGS. 3 and 4 has the following problems.

Specifically, in the conventional semiconductor device 521, not only the leads 505 but also the middle part 525 of the island 524 are exposed from the bottom face of the plastic package 527 in order to improve the heat dissipation capability. However, the heat dissipation capability is not practically improved unless the middle part 525 of the island 524 is connected to the wiring board by an adhesive with a good thermal conductivity. In this case, the thermally-conductive adhesive tends to flow toward the leads or terminals 525 before curing and therefore, contact or connection failure of the terminals 525 will occur.

To prevent the contact or connection failure of the terminals 525, the terminals 525 may be connected to the wiring lines of the wiring board by solder joints in a soldering process of the terminals 525, instead of the thermally conductive adhesive. In this case, however, a solder is difficult to flow into the narrow gap between the bottom face of the package 522 and the upper surface of the wiring board. Thus, even if the middle part 525 of the island 524 is exposed from the package 522, heat dissipation through the middle part 525 of the island 524 is not practically expected.

The exposure of the middle part 525 of the island 524 increases the possibility that the moisture contained in the atmosphere reaches the IC chip 503 through the exposed middle part 525. The moisture will facilitate (a) disconnection or release of the bonding wires 506, (b) electrical short-circuit between the terminals or leads 505 due to the migration phenomenon, and (c) time-dependent degradation of the chip 503, thereby decreasing the lifetime of the semiconductor device 521.

From this view point, the possibility that the moisture contained in the atmosphere reaches the chip 503 is low in the conventional semiconductor device 501 shown in FIGS. 1 and 2, because only the short-side ends of the island 504 are exposed from the package 507. In this case, however, as already described above, there arises a problem that a proper spacer or heat-releasing plate is necessary and direct connection of the island 504 to the wiring board is difficult.

Moreover, with the conventional semiconductor devices 501 and 521, since the ends of the islands 504 and 524 are protruded from the plastic packages 507 and 522, respectively, they are upsized. From the view point of application to the portable telephones, the upsizing of the devices 501 and 521 will make an important issue.

Additionally, when high-frequency electric signals are used, the high-frequency electric signals are transferred through a part of the leads or terminals SOS. In this case, interference tends to occur between the leads 505 for the high-frequency electric signals and the remaining leads 505 adjoining thereto. To cope with the interference, it is preferred that grounded terminals or leads are additionally provided at each side of the leads 505 for the high-frequency electric signals. However, no consideration exists in the conventional semiconductor devices 501 and 521.

SUMMARY OF THE INVENTION

Accordingly, an object of the present invention is to provide a plastic-encapsulated semiconductor device capable of efficient heat dissipation without upsizing while preventing the moisture from reaching an IC chip and a fabrication method of the device.

Another object of the present invention is to provide a semiconductor device that prevents electric isolation between leads or terminals from degrading due to high-frequency electric signals and a fabrication method of the device.

The above objects together with others not specifically mentioned will become clear to those skilled in the art from the following description.

According to a first aspect of the present invention, a plastic-encapsulated semiconductor device is provided, which is comprised of an electrically-conductive island having a chip-mounting area, an IC chip fixed on the chip-mounting area of the island, leads electrically connected to bonding pads of the chip through bonding wires, a plastic package for encapsulating the island, the chip, the bonding wires, and innerparts of the leads.

The package has an approximately flat bottom face.

Outer parts of the leads are protruded from the package and are located in approximately a same plane as the bottom face of the package.

The island has an exposition part exposed from the package at a location excluding the chip-mounting area. A lower face of the exposition part of the island is located in approximately a same plane as the bottom face of the package.

The chip and the chip-mounting area of the island are entirely buried in the package.

A part of the island excluding the chip-mounting area is bent toward the bottom face of the package to be exposed therefrom.

With the plastic-encapsulated semiconductor device according to the first aspect of the present invention, the island has the exposition part which is exposed from the plastic package, and the lower face of the exposition part is located in approximately a same plane as the bottom face of the package. Therefore, if the semiconductor device is mounted on a substrate such as a wiring board so that the exposition part of the island is connected to an electrically-conductive pattern of the substrate by a thermally-conductive joint such as a solder joint, the heat generated in the IC chip on operation is efficiently dissipated through the electrically-conductive pattern of the substrate.

On the other hand, the IC chip mounted on the chip-mounting area of the island is entirely buried in the package. Therefore, the moisture contained in the atmosphere is difficult to reach the chip.

Further, because it is unnecessary for the ends of the islands to be protruded from the package, upsizing of the semiconductor device is prevented.

In a preferred embodiment of the semiconductor device according to the first aspect, an additional lead is provided for grounding. The additional lead is incorporated with the island.

In this case, if the additional lead is arranged to be adjacent to a corresponding one of the leads designed for a high-frequency electric signal, there is an additional advantage that electric isolation between the additional lead and the corresponding one of the leads designed for the high-frequency electric signal is prevented from degrading.

Further, since the additional leads is incorporated with the island, there is another additional advantage that the configuration is simple and the additional lead and the island are surely grounded.

In another preferred embodiment of the semiconductor device according to the first aspect, an upper face of the exposition part of the island is exposed from the package.

In this case, there is an additional advantage that the heat-dissipation capability is improved, because the heat generated in the chip is radiated from the exposed upper face.

If the upper face of the exposition part of the island is electrically connected to an electrically-conductive pattern of a substrate by a solder joint, there is another additional advantage that a soldering process is readily achieved and the heat generated in the chip is effectively transmitted to the pattern through the solder joint.

In still another preferred embodiment of the semiconductor device according to the first aspect, the package has a depression formed to expose an upper face of the exposition part of the island from the package.

In this case, to expose the upper face of the exposition part of the island from the package, the ends of the island are not required to be prolonged. Thus, there is an additional advantage that a good heat-dissipation capability is achieved without upsizing of the device.

In a further preferred embodiment of the semiconductor device according to the first aspect, the lower face of the exposition part of the island is wider than an upper face of the exposition part of the island.

In this case, there is an additional advantage that the moisture contained in the atmosphere is prevented from entering the inside of the package through the gap between the island and the package while keeping a good heat-dissipation capability. This is because the heat generated in the chip is effectively transmitted to an electrically-conductive pattern of a substrate through the wide lower face.

In a still further preferred embodiment of the semiconductor device according to the first aspect, the exposition part of the island is protruded from the package.

In this case, there is an additional advantage that the an upper face of the exposition part of the island is exposed from the package with a simple configuration.

According to a second aspect of the present invention, a fabrication method of the plastic-encapsulated semiconductor device according to the first aspect is provided, which is comprised of the following steps (a) to (h).

(a) A lead frame having a set of an island and lead fingers is prepared by an electrically-conductive metallic plate. The island is mechanically connected to a body of the leadframe by a first connection member. The lead fingers are mechanically connected to the body of the leadframe by a second connection member. The island has a chip-mounting area and an exposition area positioned at a location excluding the chip-mounting area.

(b) An IC chip having bonding pads is prepared.

(c) The chip is mounted on the chip-mounting area of the island.

(d) The bonding pads of the chip is electrically connected to inner parts of the lead fingers of the leadframe by bonding wires.

(e) The leadframe is placed in a cavity of a molding die while holding or fixing outer parts of the lead fingers of the leadframe.

(f) A molten encapsulation material is supplied to the cavity of the molding die.

(g) The molten encapsulation material supplied to the cavity of the molding die is cured to form a plastic package.

The island, the chip, the bonding wires, and the inner parts of the lead fingers are buried in the package. The package has an approximately flat bottom face. The outerparts of the lead fingers are protruded from the package and are located in approximately a same plane as the bottom face of the package.

The exposition part of the island is exposed from the package at a location excluding the chip-mounting area. A lower face of the exposition part of the island is located in approximately a same plane as the bottom face of the package.

(h) The plastic package is separated from the leadframe by cutting the first and second connection members of the leadframe, thereby forming a plastic-encapsulated semiconductor device.

With the fabrication method of a semiconductor device according to the second aspect of the present invention, the leadframe prepared in the step (a) has the set of the island and the lead fingers mechanically connected to the body of the leadframe. The exposition area is positioned at the location excluding the chip-mounting area.

Then, the plastic package is formed by molding the molten encapsulation material into the cavity of the molding die and curing the encapsulation material through the steps (e), (f), and (g). The cavity is formed so that the island, the chip, the bonding wires, and the inner parts of the lead fingers are buried in the package while the outer parts of the lead fingers are protruded from the package. Also, The cavity is formed in the following way.

Specifically, the package has an approximately flat bottom face and the outer parts of the lead finger are located in approximately a same plane as the bottom face of the package.

The exposition part of the island is exposed from the package at a location excluding the chip-mounting area. A lower face of the exposition part of the island is located in approximately a same lane as the bottom face of the package.

Accordingly, the plastic-encapsulated semiconductor device according to the first aspect of the present invention is fabricated without adding special processes.

In a preferred embodiment of the method according to the second aspect, the cavity of the molding die has a space allowing the exposition part of the island to be exposed from the package.

In this case, there is an additional advantage that the exposition part of the island exposed from the package is readily fabricated without adding a special process.

In another preferred embodiment of the method according to the second aspect, the leadframe is prepared in the step (a) in such a way that the exposition part of the island and the inner parts of the lead fingers are depressed or protruded with respect to the outer parts of the lead fingers.

In this case, there is an additional advantage that the chip-mounting area of the island and the inner parts of the lead fingers are located in a same plane without any dedicated process for bending the chip-mounting area of the island and/or the inner parts of the lead fingers.

In still another preferred embodiment of the method according to the second aspect, the leadframe is formed so that the island includes an additional lead for grounding in the step (a). The additional lead is incorporated with the island.

In this case, there is an additional advantage that the semiconductor device including the grounding lead is readily fabricated and that no wire bonding process is necessary for the grounding lead.

In a further preferred embodiment of the method according to the second aspect, the cavity of the molding die has a space allowing the supplied and cured encapsulating material to form a burr with a predesigned thickness.

In this case, there is an additional advantage that the burr is readily removed from the package.

BRIEF DESCRIPTION OF THE DRAWINGS

In order that the present invention maybe readily carried into effect, it will now be described with reference to the accompanying drawings.

DETAILED DESCRIPTION OF THE PREFERRED EMBODIMENTS

Figure 1:
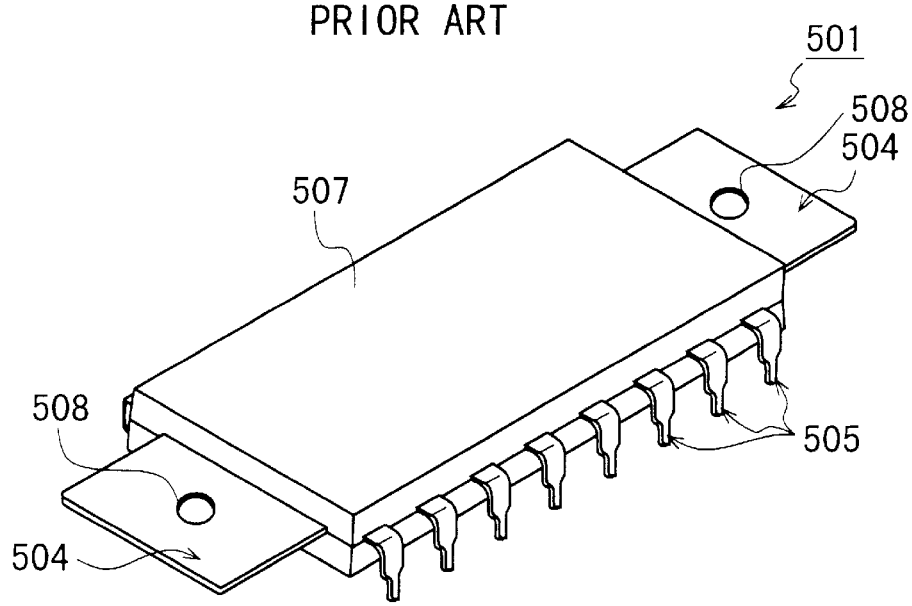
FIG. 1 is a perspective view of a conventional plastic-encapsulated semiconductor device.
Figure 2:
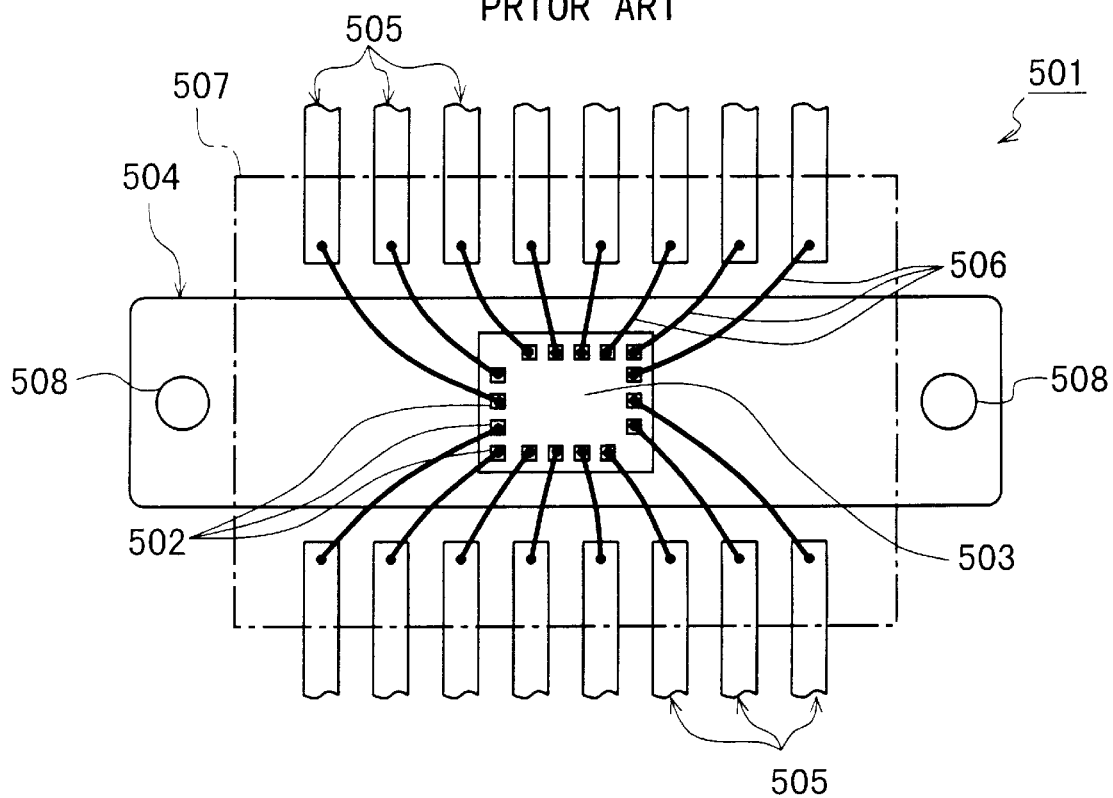
FIG. 2 is a plan view of the conventional plastic-encapsulated semiconductor device shown in FIG. 1, which shows the inner configuration.

Preferred embodiments of the present invention will be described in detail below while referring to the drawings attached.

FIRST EMBODIMENT

FIGS. 5 to 12 show a plastic-encapsulated semiconductor device 31 according to a first embodiment.

As shown in FIGS. 5 to 12, the plastic-encapsulated semiconductor device 31 according to the first embodiment is equipped with an approximately rectangular island 35, a rectangular parallelepiped-shaped IC chip 3, leads 33 arranged in parallel, and an approximately rectangular parallelepiped-shaped plastic package 32.

The island 35 is formed by an electrically-conductive sheet metal. The island 35 is comprised of a rectangular chip-mounting part 37 located at its center, two end parts 36 located at its opposite ends, and two connection parts 67 located between the chip-mounting part 37 and the two end parts 36. The end parts 36 are wider than the chip-mounting part 37.

Figure 5:
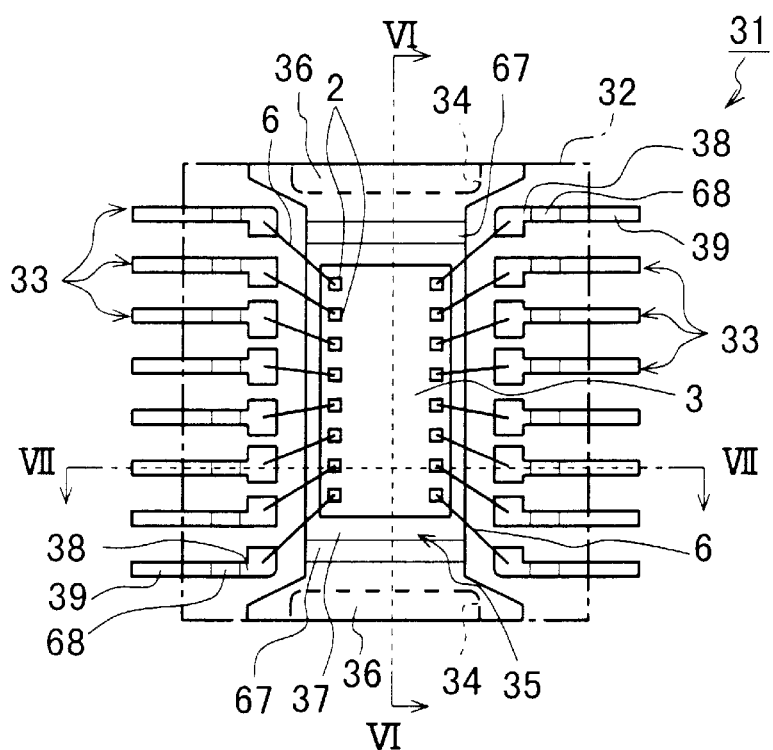
FIG. 5 is a plan view of a plastic-encapsulated semiconductor device according to a first embodiment of the present inventions which shows the inner configuration.
Figure 6:
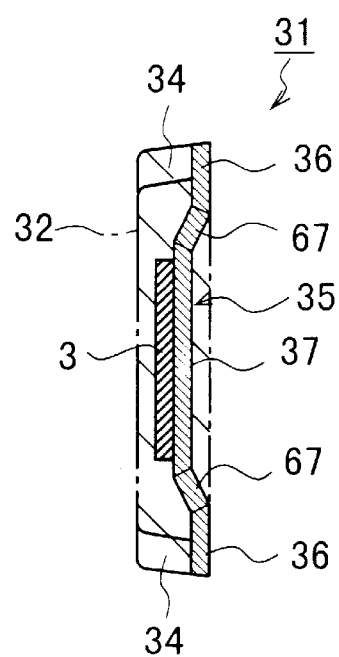
FIG. 6 is a cross-sectional view of the plastic-encapsulated semiconductor device according to the first embodiment, which is along the line VI—VI in FIG. 5.
Figure 7:
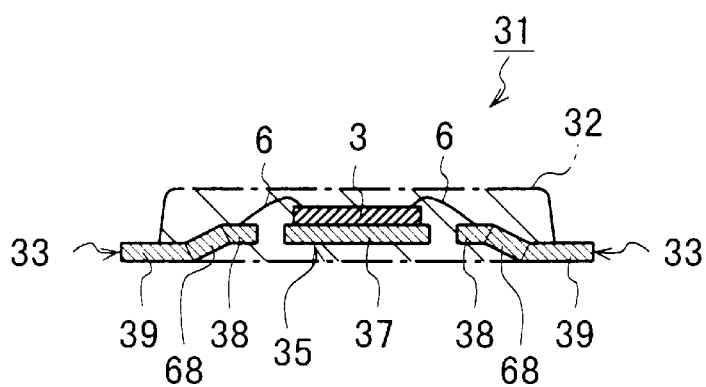
FIG. 7 is a cross-sectional view of the plastic-encapsulated semiconductor device according to the first embodiment, which is along the line VII—VII in FIG. 5.

As clearly seen from FIGS. 5, 6, and 7, the connection parts 67 are oblique to the chip-mounting part 37 and the end parts 36 while the chip-mounting part 37 is parallel to the end parts 36. In other words, the chip-mounting part 37 is bent with respect to the connection parts 67, and the end parts 36 are bent with respect to the connection parts 67. Therefore, it may be said that the island 35 has an arch-shaped longitudinal cross section.

The IC chip 3 is fixed onto the chip-mounting part 37 of the island 35. Bonding pads 2 are regularly arranged on the top face of the chip 3. The bonding pads 2 are electrically connected to the inner ends of the corresponding leads 33 through bonding wires 6.

The leads 33 are arranged at regular intervals on the long sides of the elongated island 35 and the plastic package 32. Each of the leads 33 is comprised of a bonding part 38 located at its inner end, a terminal part 39 located at its outer end, and a connection part 68 located between the bonding part 38 and the terminal part 39.

As clearly seen from FIGS. 5, 6, and 7, the connection parts 68 of the leads are oblique to the bonding parts 38 and the terminal parts 39 thereof while the bonding parts 38 are parallel to the terminal parts 39. In other words, the bonding parts 38 are bent with respect to the connection parts 68, and the terminal parts 39 are bent with respect to the connection parts 68. Therefore, it may be said that each of the leads 33 has a crank-shaped longitudinal cross section.

The bonding parts 38 of the leads 33 are located in the same plane as the chip-mounting part 37 of the island 35. The terminal parts 39 of the leads 33 are located in the same plane as the end parts 36 of the island 35.

Figure 8:
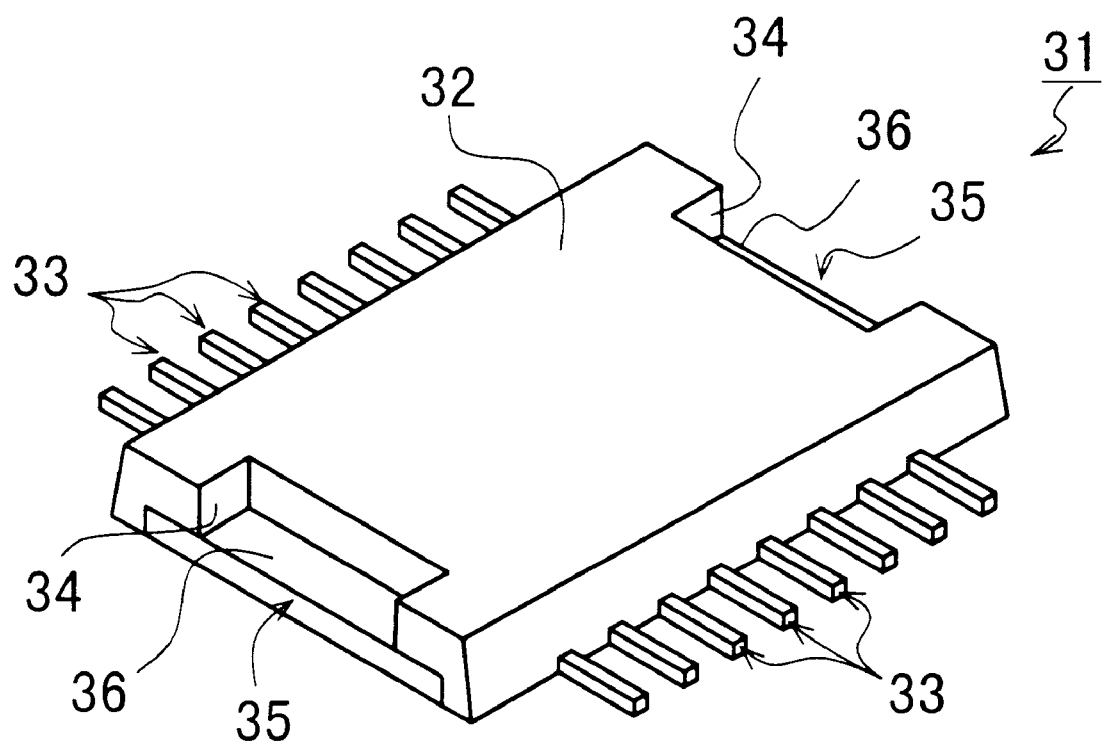
FIG. 8 is a perspective view of the plastic-encapsulated semiconductor device according to the first embodiment shown in FIG. 5, which shows the appearance.

As shown in FIG. 8, the plastic package 32 has two depressions 34 at its opposite ends, which allow the upper faces of the end parts 36 of the island 35 to be partially exposed. Each of the depressions 34 is shaped to an approximately rectangular parallelepiped.

The chip-mounting part 37 of the island 35, the IC chip 3, and the bonding wires 6 are entirely encapsulated or buried in the plastic package 32. The end parts 36 of the island 35 are not protruded from the package 32, and are partially exposed from the package 32 through the depressions 34. The bonding parts 38 and the connection parts 68 of the leads 33 are entirely buried in the package 32. The terminal parts 39 of the leads 33, which are partially buried in the package 32, are laterally protruded from the package 32 through the two opposite long sides of the package 32.

As clearly seen from FIGS. 9, 10, 11, and 12, the lower faces of the end parts 36 of the island 35 are located in the same plane as the bottom face of the package 32, and are exposed from the package 32. Similarly, the terminal parts 39 of the leads 33 are located in the same plane as the bottom face of the package 32, and are exposed from the package 32.

Figure 9:
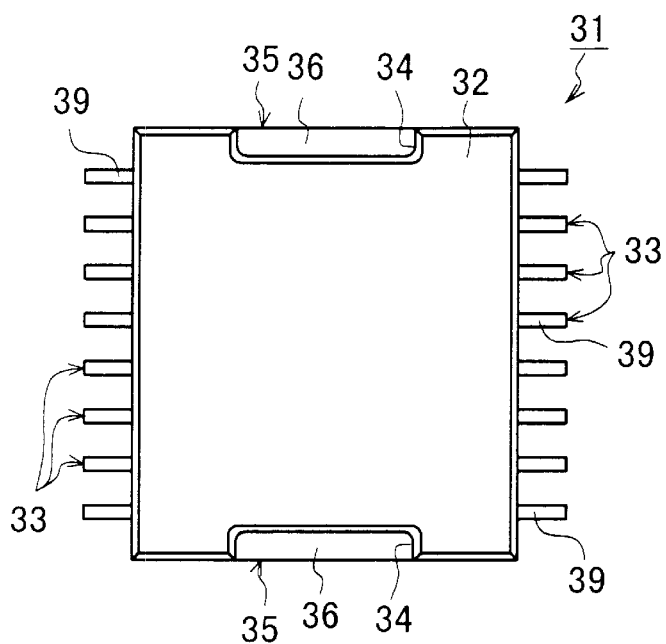
FIG. 9 is a plan view of the plastic-encapsulated is semiconductor device according to the first embodiment shown in FIG. 5.
Figure 10:
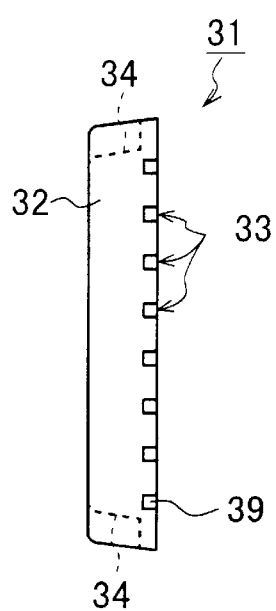
FIG. 10 is a side view of the plastic-encapsulated semiconductor device according to the first embodiment shown in FIG. 5.
Figure 11:
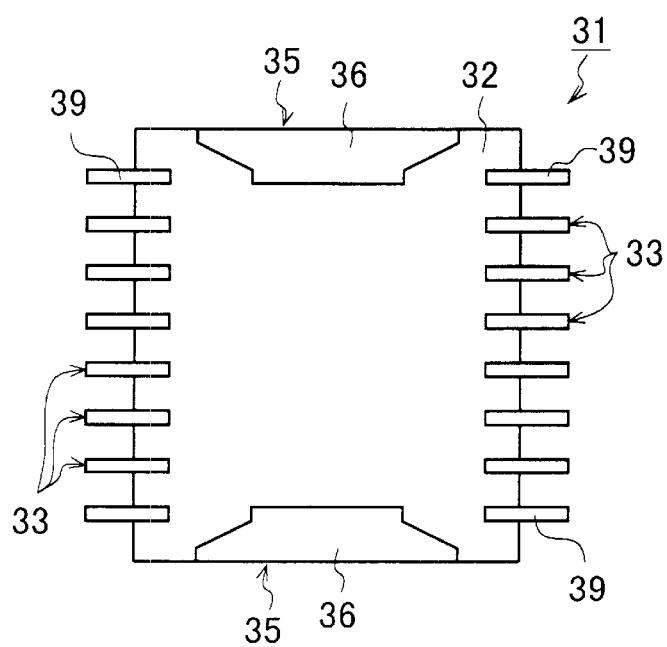
FIG. 11 is a bottom view of the plastic-encapsulated semiconductor device according to the first embodiment shown in FIG. 5.
Figure 12:
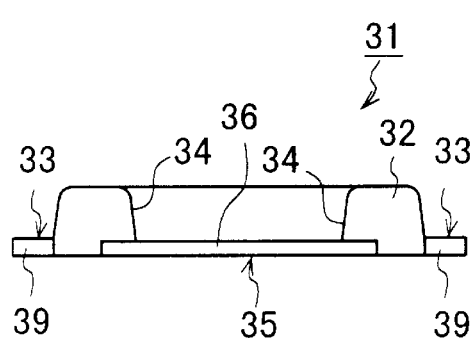
FIG. 12 is a front view of the plastic-encapsulated semiconductor device according to the first embodiment shown in FIG. 5.

As seen from FIGS. 9 and 11, the exposed area of the lower faces of the end parts 36 of the island 35 is wider than the upper faces of the end parts 36.

The plastic-encapsulated semiconductor device 31 according to the first embodiment has the following advantages.

Specifically, the semiconductor device 31 according to the first embodiment is typically mounted on a printed wiring board (not shown). In this case, the terminal parts 39 of the leads 33 protruding from the plastic package 32 are electrically connected to corresponding wiring lines of the wiring board by solder joints. At the same time, the two end parts 36 of the island 35 partially exposed from the package 32 are electrically connected to a grounding line or lines or an electrically-conductive pattern of the wiring board by solder joints.

On operation where various electric signals are transmitted between the IC chip 3 of the semiconductor device 31 and the wiring board, the chip 3 generates heat. The heat is efficiently dissipated, because the exposed end parts 36 of the island 35 are directly connected to the electrically-conductive pattern of the wiring board. In other words, the island 35 has a better heat-dissipation capability.

Figure 3:
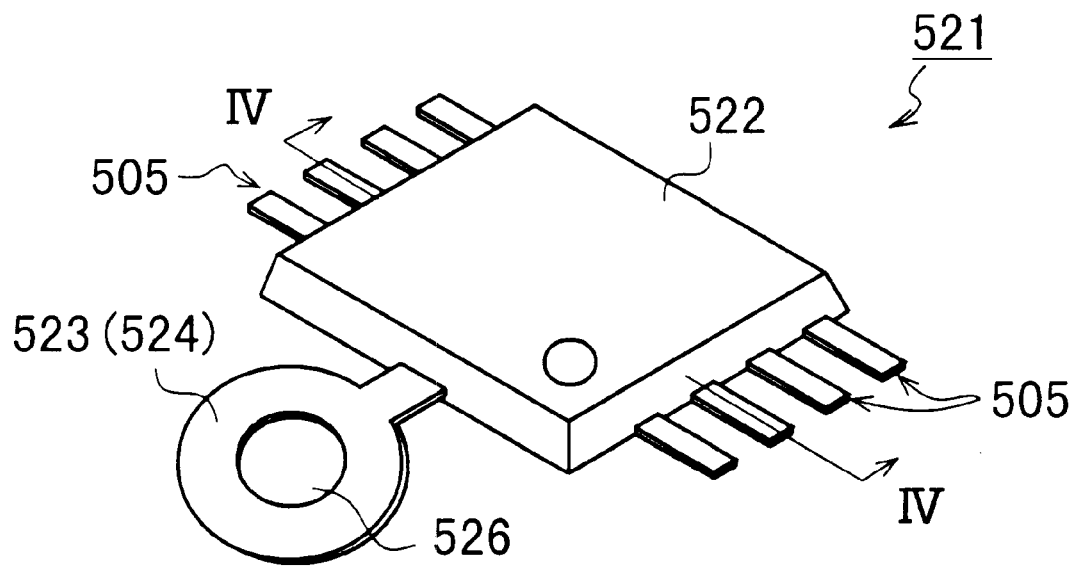
FIG. 3 is a perspective view of another conventional plastic-encapsulated semiconductor device.
Figure 4:
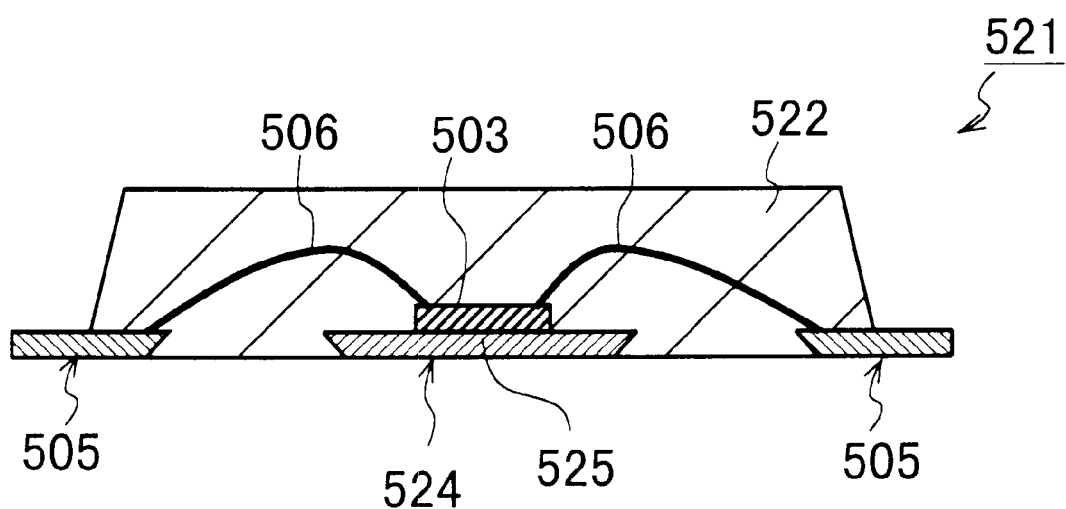
FIG. 4 is a cross-sectional view of the conventional plastic-encapsulated semiconductor device shown in FIG. 3, which is along the line IV—IV.

With the conventional plastic-encapsulated semiconductor device 521 shown in FIGS. 3 and 4, the middle part 525 of the island 524, on which the IC chip 503 is mounted, is exposed from the bottom face of the plastic package 522. However, the island 524 is unable to be connected to the electrically-conductive pattern of the wiring board by a solder joint. Accordingly, the middle part 525 is apart from the electrically-conductive pattern and as a result, the heat-dissipation capability is difficult to be improved.

Also, since not only the leads 505 but also the middle part 525 of the island 524 are exposed from the package 522, the moisture contained in the atmosphere tends to reach the chip 503.

On the other hand, with the plastic-encapsulated semiconductor device 31 according to the first embodiment, the moisture contained in the atmosphere is extremely difficult reach the chip 3 through the gap between the island 35 and the package 32 This is because the chip-mounting part 37 of the island 35 is not exposed from the package 32.

Thus, unlike the conventional semiconductor device 521 shown in FIGS. 3 and 4, the semiconductor device 31 according to the first embodiment has a good heat-dissipation capability equivalent to the conventional semiconductor device 521 while preventing the moisture in the atmosphere from reaching the IC chip 3.

Especially, the end parts 36 of the island 35, which are located at the opposite ends along the longitudinal axis of the rectangular parallelpiped-shaped package 32, are exposed from the package 32. Also, the island 35 are bent like a crank at the connection parts 67 in the package 32. Therefore, the moisture in the atmosphere is more difficult to reach the IC chip 3.

Since the upper faces of the end parts 36 of the island 35 are exposed from the package 32 through the depressions 34, the end parts 36 are unnecessary to be protruded from the package 32. This avoids upsizing of the device 31.

Also, since the upper faces of the end parts 36 of the island 35 are exposed from the package 32, the island 35 may be electrically connected to the electrically-conductive pattern of the wiring board at the depressions 34 of the package 32 by solder joints. In this case, the heat-dissipation capability is further increased.

The upper faces of the end parts 36 of the island 35, which are not covered with the wiring board, are narrower than the lower faces thereof. This enhances the protection effect against the moisture entering while keeping the heat-dissipation capability unchanged.

Next, a fabrication method of the plastic-encapsulated semiconductor device 31 according to the first embodiment will be explained below with reference to FIGS. 13 to 32.

Figure 13:
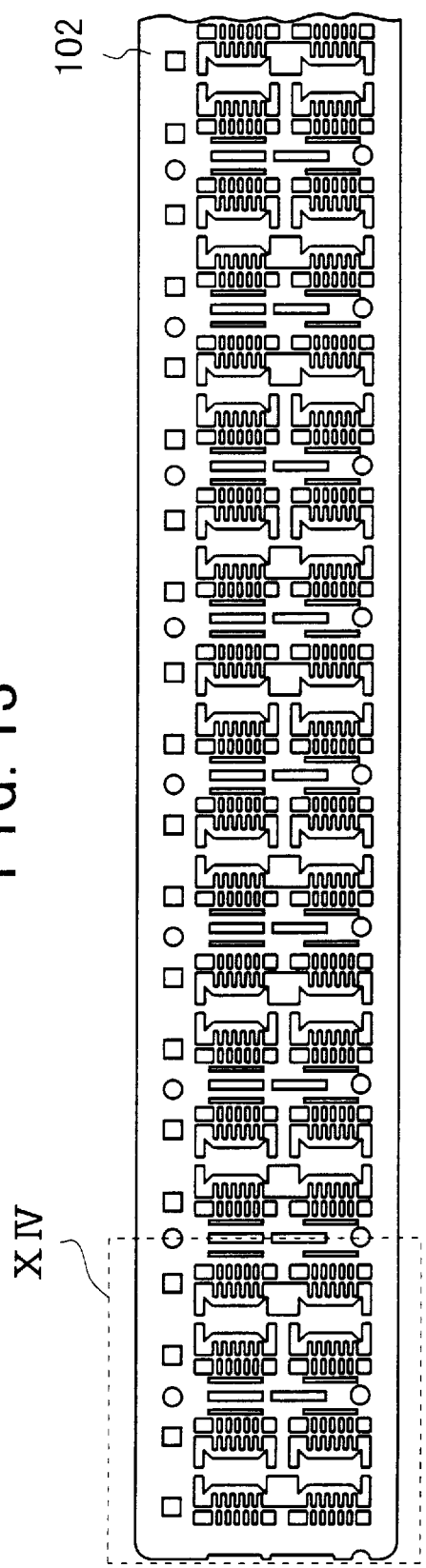
FIG. 13 is a partial plan view of a leadframe used for fabricating the plastic-encapsulated semiconductor device according to the first embodiment shown in FIG. 5.
Figure 14:
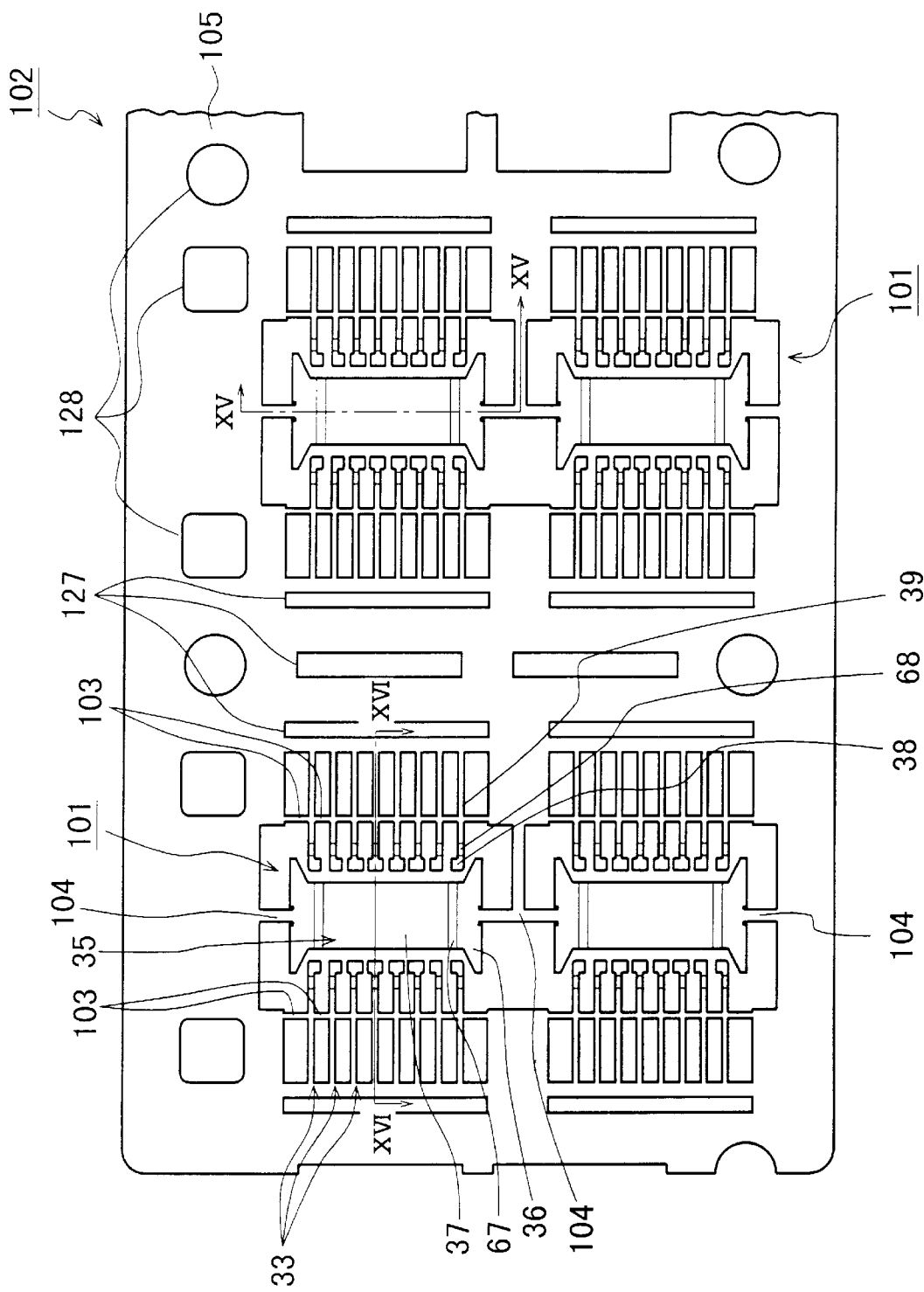
FIG. 14 is an enlarged, partial plan view of the leadframe used for fabricating the plastic-encapsulated semiconductor device according to the first embodiment shown in FIG. 5, which shows the location XIV in FIG. 13.

First, as shown in FIGS. 13 and 14, a leadframe 102 including a lot of sets 101 of the island 35 and the leads 33 is prepared by etching a thin metal sheet. In each of the sets 101, the island 35 is mechanically connected to a body 105 of the leadframe 102 by island supports 104, and the leads 33 are mechanically connected to the body 105 by tie bars or dam bars 103. The leads 33 are mechanically connected to one another by the tie bars 103.

The reference numeral 128 denotes pilot holes of the leadframe 102 used for transferring the leadframe 102.

Figure 15:
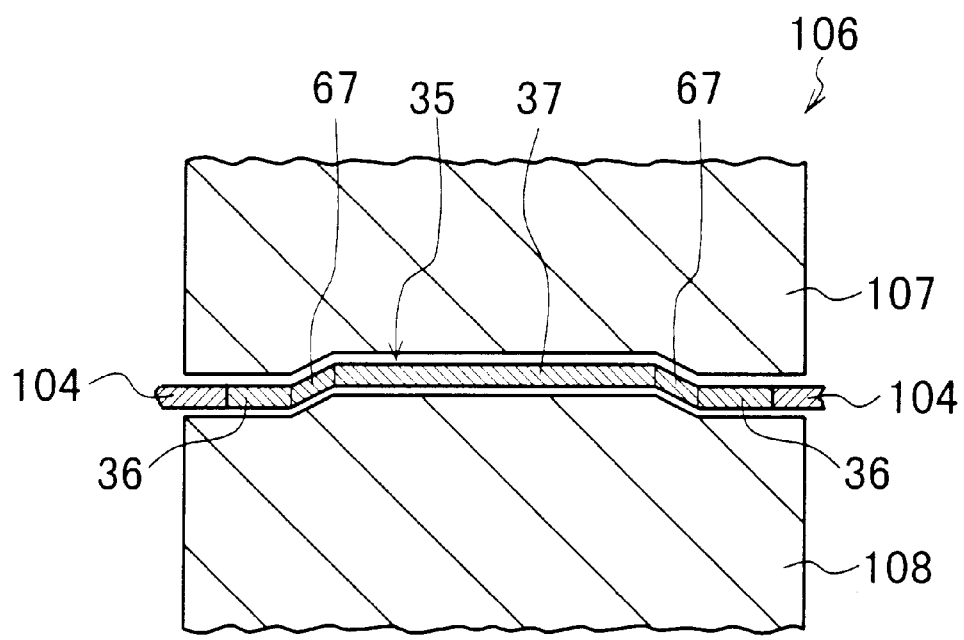
FIG. 15 is a partial cross-sectional view of coupled pressing dies along the line XV—XV in FIG. 14, in which the leadframe is sandwiched by the coupled pressing dies.
Figure 16:
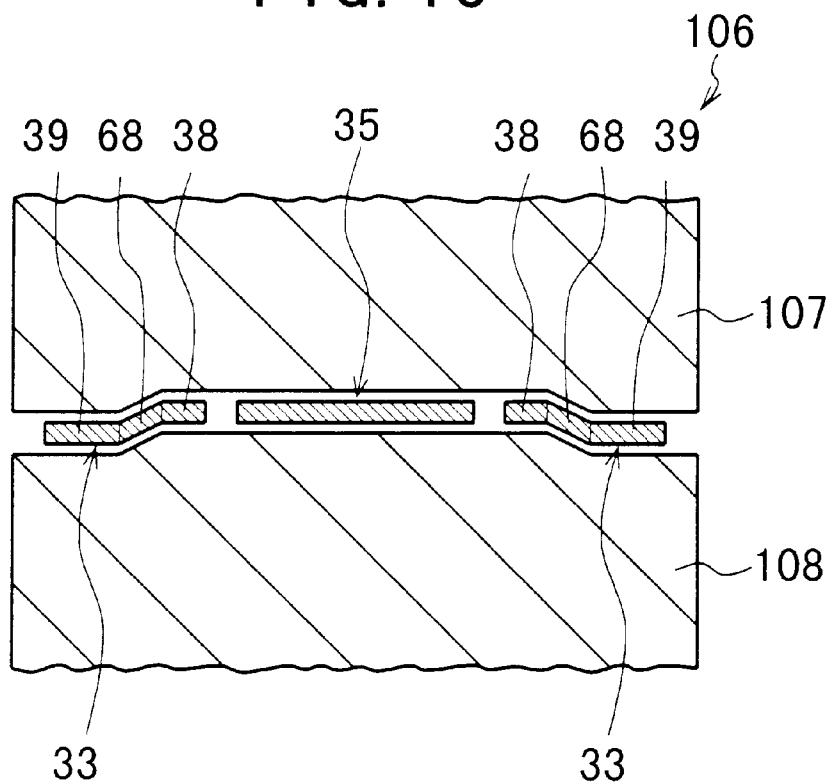
FIG. 16 is a partial cross-sectional view of the coupled pressing dies along the line XVI—XVI in FIG. 14, in which the leadframe is sandwiched by the coupled pressing dies.

Second, as shown in FIGS. 15 and 16, the set 101 of the island 35 and the leads 33 is subjected to a pressure forming process using upper and lower pressing dies 107 and 108 of a down set 106, thereby bending the island 35 and the leads 33 at the connection parts 67 and 68. In this process, the leadframe 102 is held at the body 105 by the pressing dies 107 and 108.

Thus, the two end parts 36 of the island 35 are bent upward with respect to the chip-mounting part 37 and at the same time, the bonding parts 38 of the leads 33 are bent upward with respect to the terminal parts 39. Due to the bending, the end parts 36 of the island 35 are located in the same plane as the bonding parts 38 of the leads 33, and the chip-mounting part 37 of the island 35 are located in the same plane as the terminal parts 39 of the leads 33.

Figure 17:
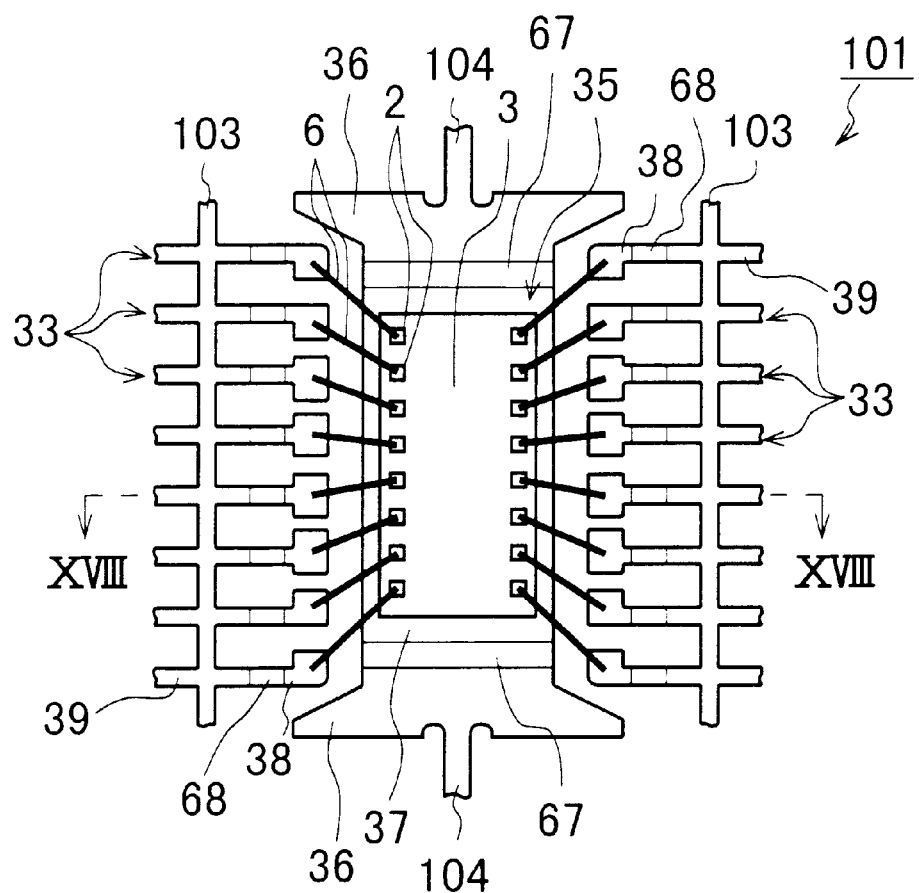
FIG. 17 is a partial plan view of the leadframe used for fabricating the plastic-encapsulated semiconductor device according to the first embodiment shown in FIG. 5, in which an IC chip is mounted on the island of the leadframe.
Figure 18:
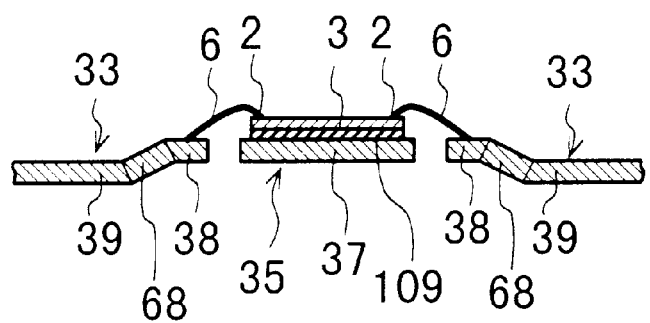
FIG. 18 is a cross-sectional view along the line XVIII—XVIII in FIG. 17.

Third, as shown in FIGS. 17 and 18, the IC chip 3 is fixed onto the chip-mounting part 37 of the island 35 by a solder joint 109. Then, the bonding pads 2 of the chip 3 are electrically connected to the bonding parts 38 of the leads 33 by the bonding wires 6.

Figure 19:
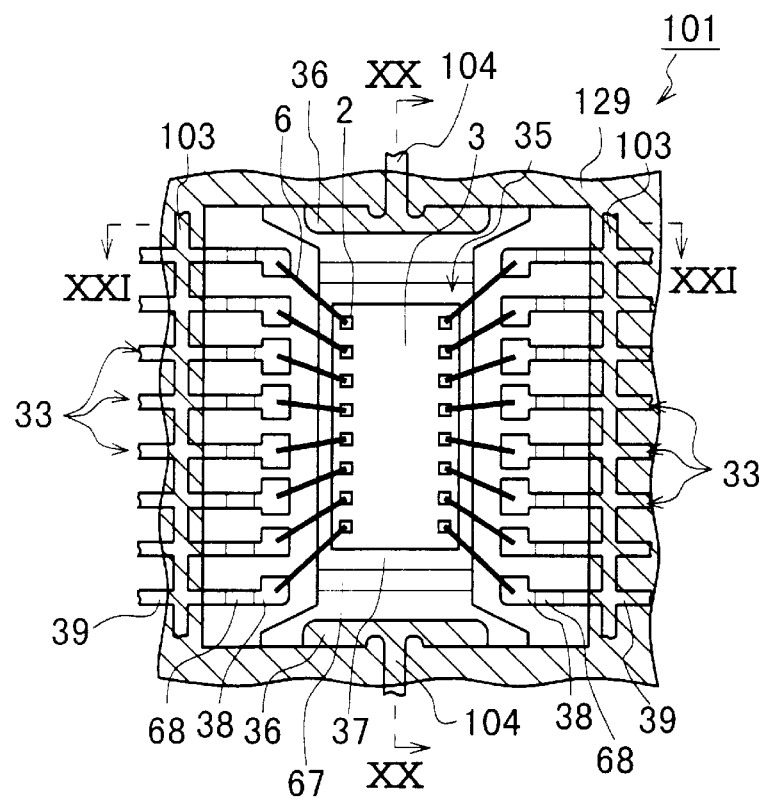
FIG. 19 is a partial plan view of the leadframe used for fabricating the plastic-encapsulated semiconductor device according to the first embodiment shown in FIG. 5, in which the leadframe is sandwiched between the coupled molding dies.
Figure 20:
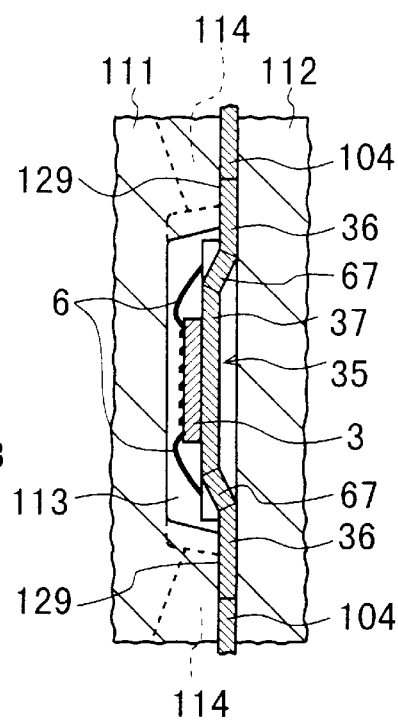
FIG. 20 is a cross-sectional view along the line XX—XX in FIG. 19.
Figure 21:
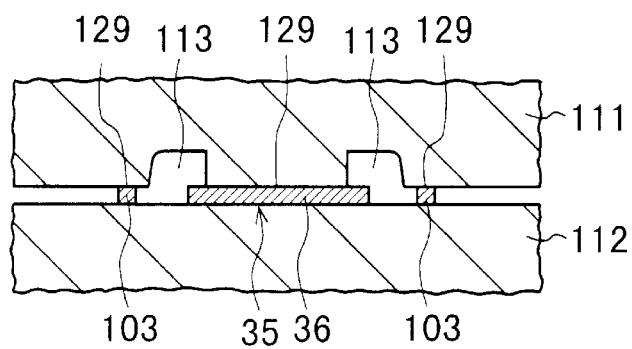
FIG. 21 is a cross-sectional view along the line XXI—XXI in FIG. 19.

Fourth, as shown in FIGS. 19 to 21, the set 101 of the leadframe 102 is subjected to a molding process. Specifically, the island 35, the chip 3, the bonding wires 2, and the leads 33 are sandwiched between upper and lower molding dies 111 and 112. The island 35, the chip 3, and the bonding wires 2 are entirely located in a cavity 113 of the molding dies 111 and 112. The inner parts of the leads 33 are located in the cavity 113 while the remaining parts of the leads 33 and the tie bars 103 are held by the molding dies 111 and 112 and located outside the cavity 113.

The part of the cavity 113 corresponding to the two depressions 34 of the package 32 are filled with the molding dies 111 and 112, allowing the depressions 34 to be formed in the following molding process.

The reference numeral 114 denotes gates of the molding dies 111 and 112 through which a molten molding or encapsulating material is injected into the cavity 113. The reference numeral 129 denotes holding or contacting areas of the molding dies 111 and 112 at which the leadframe 102 is fixed by the molding dies 111 and 112. The holding or contacting areas 129 are located in the peripheral area surrounding the cavity 113.

Figure 22:
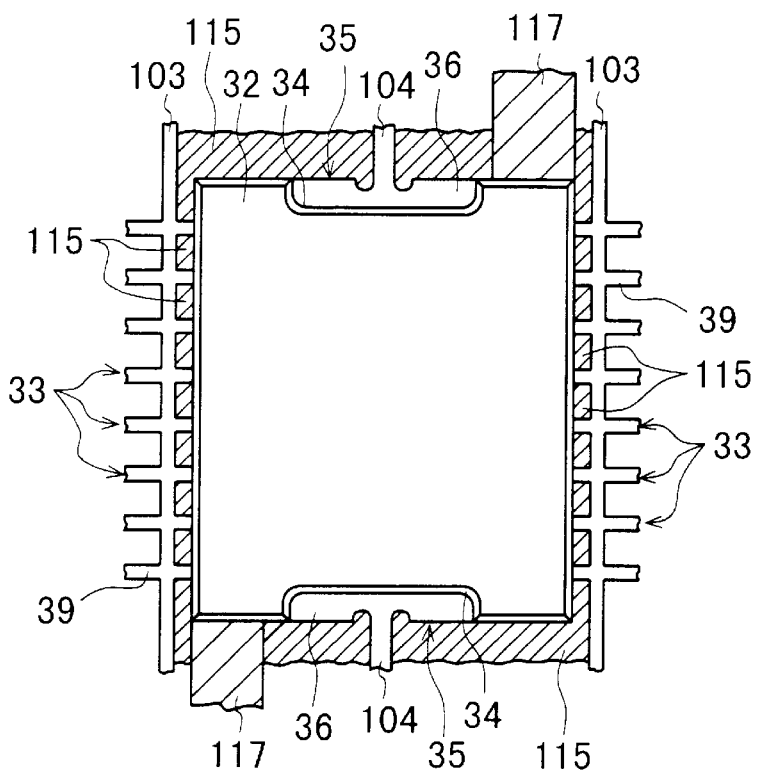
FIG. 22 is a partial plan view showing the state where the plastic package of the semiconductor device according to the first embodiment shown in FIG. 5 is molded.
Figure 23:
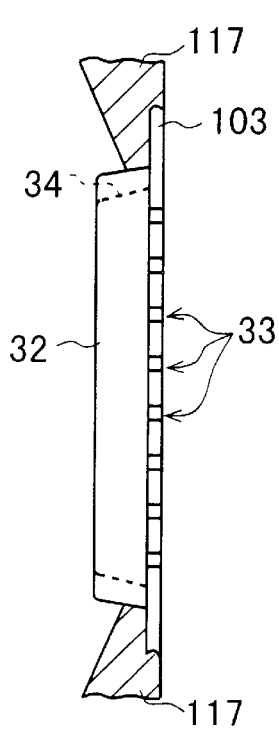
FIG. 23 is a partial side view showing the state where the plastic package of the semiconductor device according to the first embodiment shown in FIG. 5 is molded.
Figure 24:
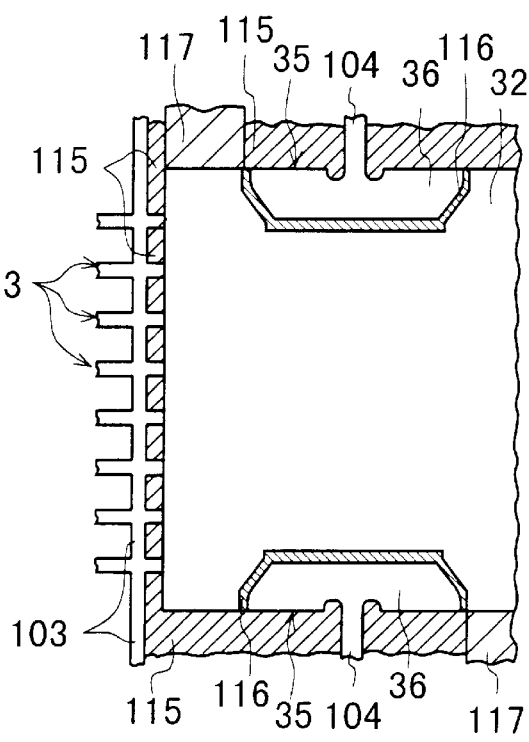
FIG. 24 is a partial bottom view showing the state where the plastic package of the semiconductor device according to the first embodiment shown in FIG. 5 is molded.

Fifth, as shown in FIGS. 22 to 24, a molten molding or encapsulating material such as an epoxy resin is injected into the cavity 113 of the molding dies 107 and 108 through the gates 114 until the cavity 113 is filled with the material. The injected molding material is then cured, resulting in the plastic package 32 including the island 35, the IC chip 3, the bonding wires 6, and the inner parts of the leads 33. In this state, the end parts 36 of the island 35 and the terminal parts 39 of the leads 33, which have been held by the molding dies 111 and 112, are exposed from the package 32.

In the device 31 according to the first embodiment, the bottom face of the package 32 is flat and at the same time, the end parts 36 of the island 35 and the terminal parts 39 of the leads 33 are located in the same flat plane as the bottom face of the package 32. Therefore, the inner surface of the lower molding die 112 may be simply flat. Also, the inner surface of the upper molding die 111 may be simply shaped to form the depressions 34 of the package 32. As a result, there is an additional advantage that the molding dies 111 and 112 are readily fabricated and that high accuracy is not needed in the coupling process of the dies 111 and 112.

This molding process produces plate-shaped burrs 115 at the position corresponding to the interface of the coupled molding dies 111 and 112 and thin burrs 116 at the position corresponding to the interface of the end parts 36 of the island 35 and the lower molding die 112. The thin burrs 116 may be removed by known processes such as water honing and dry blasting processes. The plate-shaped burrs 115 may be removed in the step of removing the molding material or resin 117 left in the gates 114 and the island supports 104.

If the molding dies 111 and 112 are so designed that the plate-shaped burrs 115 have a larger thickness than intervening parts between the package 32 and the burrs 115, the burrs 115 may be removed more readily and surely by cutting the thinner intervening parts.

Figure 25:
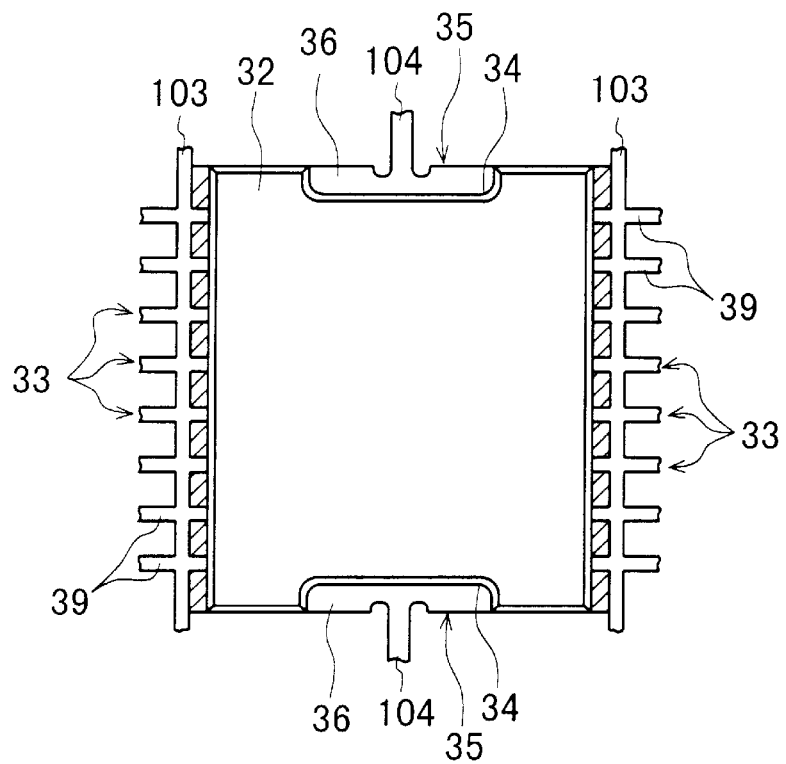
FIG. 25 is a partial plan view showing the state where the encapsulating material left in the injection gates of the molding dies is removed in fabrication of the semiconductor device according to the first embodiment shown in FIG. 5.
Figure 26:
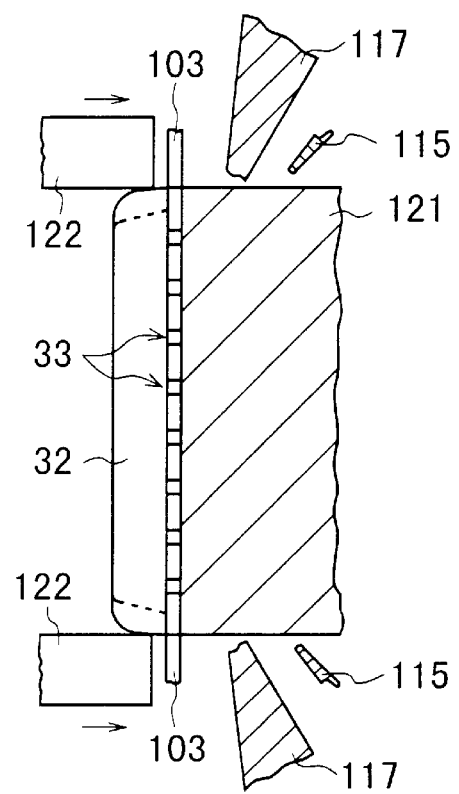
FIG. 26 is a partial side view showing the state where the encapsulating material left in the injection gates of the molding dies is removed in fabrication of the semiconductor device according to the first embodiment shown in FIG. 5.

Sixth, as shown in FIGS. 25 and 26, to remove the molding material 117 left in the gates 114, the plastic package 32 is placed on a table 121 of a punching machine 122. Then, the molding material 117 left in the gates 114 is cut away by using a cutter 122 of the punching machine 122.

Figure 27:
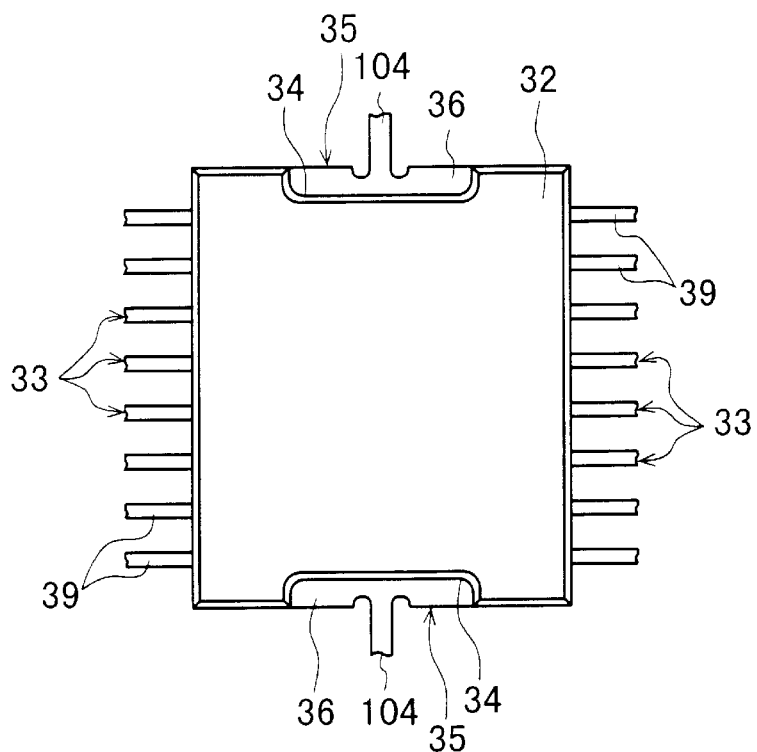
FIG. 27 is a partial plan view showing the state where the tie bars of the leadframe are cut away in fabrication of the semiconductor device according to the first embodiment shown in FIG. 5.
Figure 28:
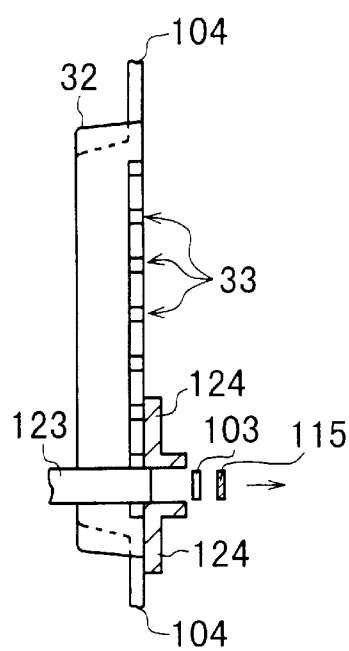
FIG. 28 is a partial side view showing the state where the tie bars of the leadframe are cut away in fabrication of the semiconductor device according to the first embodiment shown in FIG. 5.

Seventh, as shown in FIGS. 27 and 28, to separate the terminal parts 39 of the leads 33 which are protruded from the package 32 and which are mechanically connected to one another by the tie bars 103, the tie bars 103 are successively cut away by using a cutter 123 and a cutting table 124.

Although all the tie bars 103 are successively cut away by using the single cutter 123 here, they may be cut away simultaneously by using a plurality of cutters 123.

Figure 29:
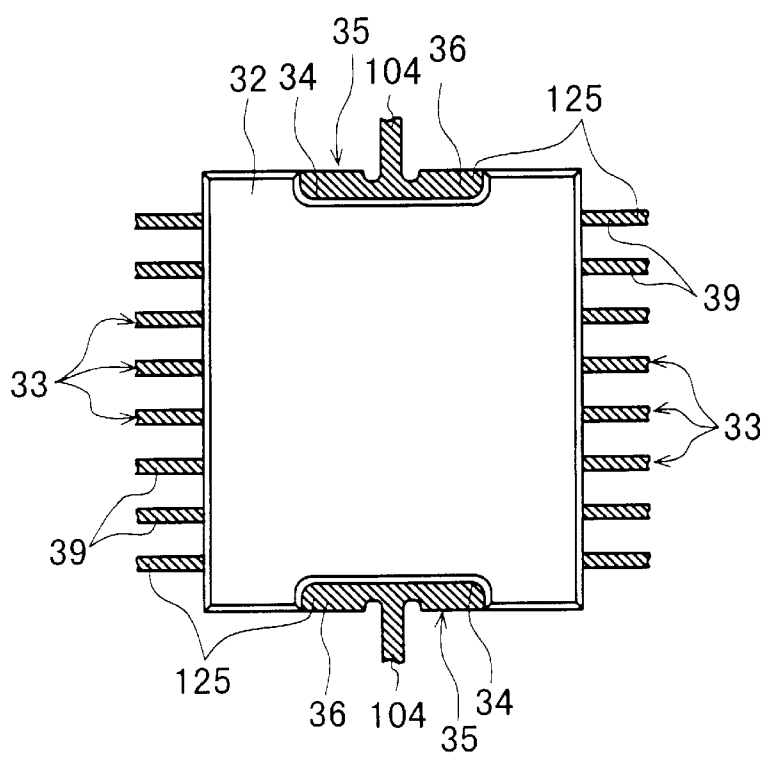
FIG. 29 is a partial plan view showing the state where solder layers are formed on the outer parts of the leads and the exposition areas of the island of the leadframe in fabrication of the semiconductor device according to the first embodiment shown in FIG. 5.
Figure 30:
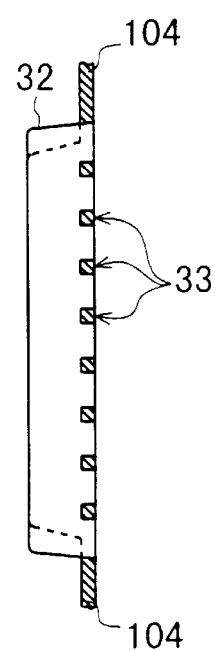
FIG. 30 is a partial plan view showing the state where solder layers are formed on the outer parts of the leads and the exposition areas of the island of the leadframe in fabrication of the semiconductor device according to the first embodiment shown in FIG. 5.

Eighth, as shown in FIGS. 29 and 30, to form solder films 125 on the exposed terminal parts 39 of the leads 33 and the exposed end parts 36 of the island 35, the terminal parts 39 and the end parts 36 are subjected to a plating process of solder. The plated solder films 125 have a function of preventing the terminal parts 39 of the leads 33 and the end parts 36 of the island 35 from being oxidized and a function of improving the affinity of the leads 33 and the island 35 to solder.

Figure 31:
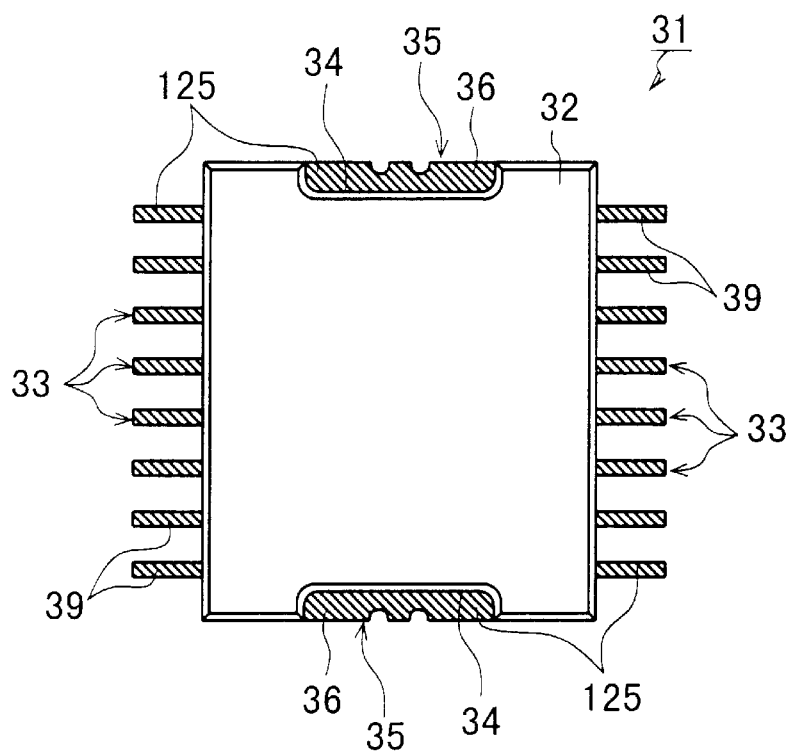
FIG. 31 is a partial plan view showing the state where the island supports of the leadframe are cut away in fabrication of the semiconductor device according to the first embodiment shown in FIG. 5.
Figure 32:
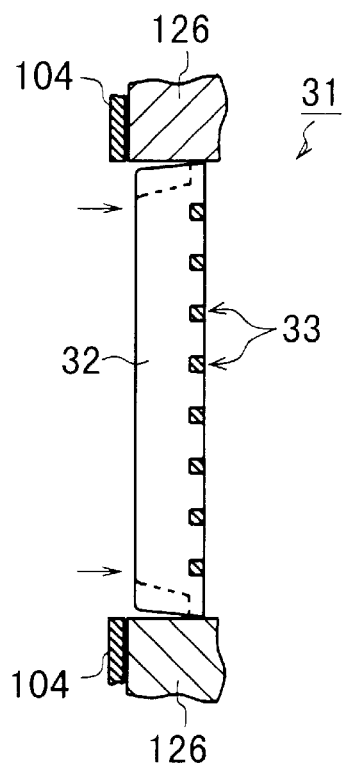
FIG. 32 is a partial side view showing the state where the island supports of the leadframe are cut away in fabrication of the semiconductor device according to the first embodiment shown in FIG. 5.

Finally, as shown in FIGS. 31 and 32, the end parts 36 of the island 35 are separated from the island supports 104 and the terminal parts 39 of the leads 33 are separated from the body 105 of the leadframe 102 by using a cutting table 126.

Thus, the plastic-encapsulated semiconductor device 31 according to the first embodiment shown in FIGS. 5 to 12 is fabricated.

With the fabrication method according to the first embodiment, the configuration where the lower faces of the end parts 36 of the island 35 are exposed from the bottom face of the package 32 and the upper faces thereof are exposed from the two depressions 34 of the package 32 is readily achieved.

Especially, since the end parts 36 of the island 35 are held by the molding dies 111 and 112 in the molding process shown in FIGS. 19 to 21, the above configuration is readily achieved without adding any special or dedicated process. Also, the amount of the plate-shaped burrs 115 becomes low and the burrs 115 are readily removed.

On the other hand, for example, in the conventional plastic-encapsulated semiconductor device 21 shown in FIGS. 3 and 4, even if the heat-releasing plate 523 of the islands 524 is sandwiched by molding dies, some burrs which are difficult to be removed tend to be produced.

Since the leads 33 and the island 35 are bent in the pressing formation process of the leadframe 102, no dedicated tools are necessary for bending the leads 33 and the island 35. The leads 33 are bent prior to the separation process from the body 105 of the leadframe 102 and therefore, good shape uniformity of the terminal parts 39 of the leads 33 is ensured. Because the terminal parts 39 of the leads 33 are not bent after the molding process, there is no danger that the package 32 is damaged due to useless stresses.

Since both of the leads 33 and the island 35 are bent, the terminal parts 39 of the leads 33 can be located in the same plane as the bottom face of the package 32 and at the same time, the bonding parts 38 of the leads 33 can be located in the same plane as the chip-mounting part 37 of the island 35.

SECOND EMBODIMENT

Figure 33:
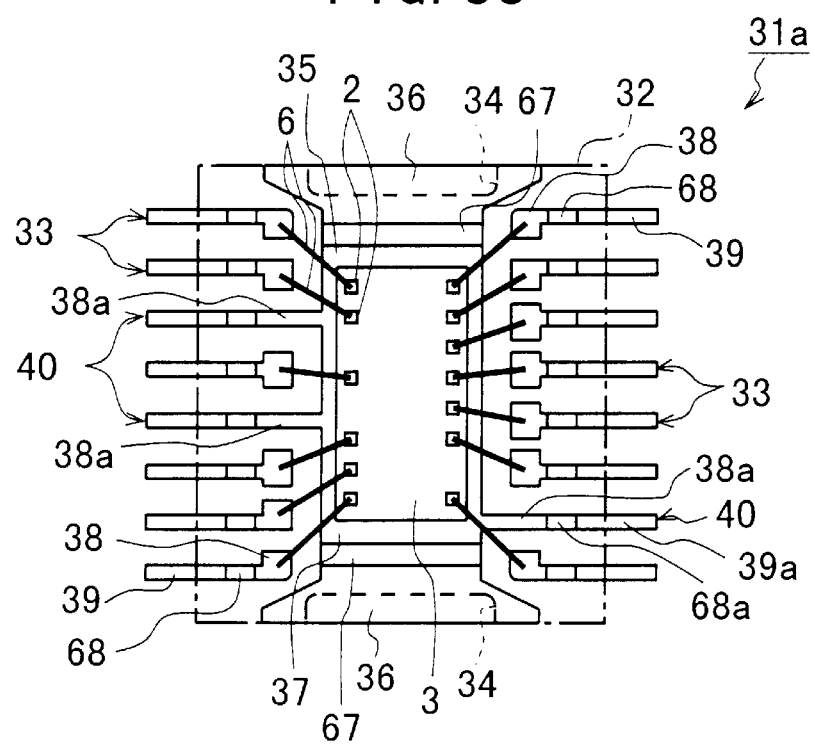
FIG. 33 is a plan view of a plastic-encapsulated semiconductor device according to a second embodiment of the present invention, which shows the inner configuration.
Figure 34:
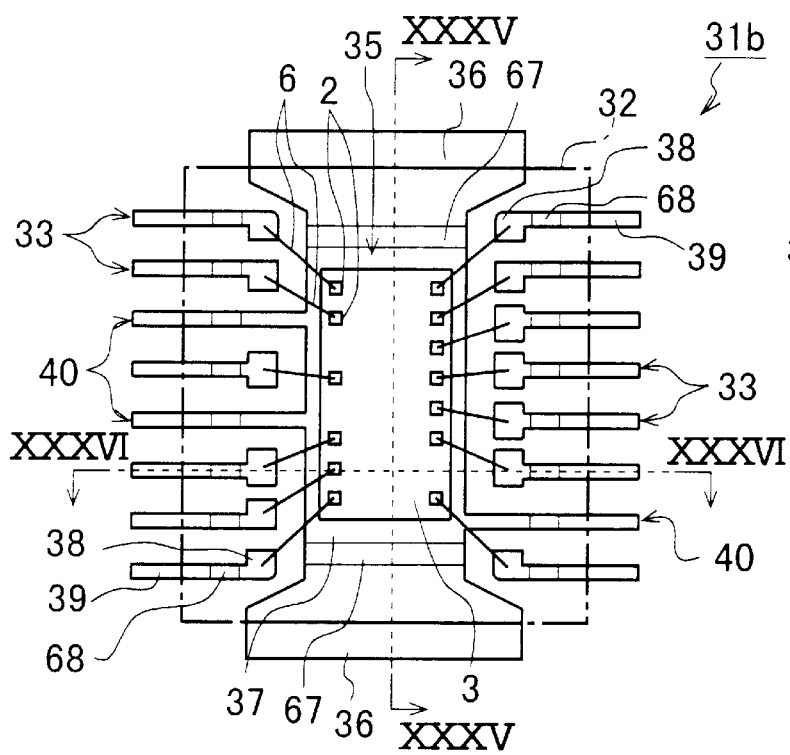
FIG. 34 is a plan view of a plastic-encapsulated semiconductor device according to a third embodiment of the resent invention having grounding leads or terminals, which shows the inner configuration.
Figure 35:
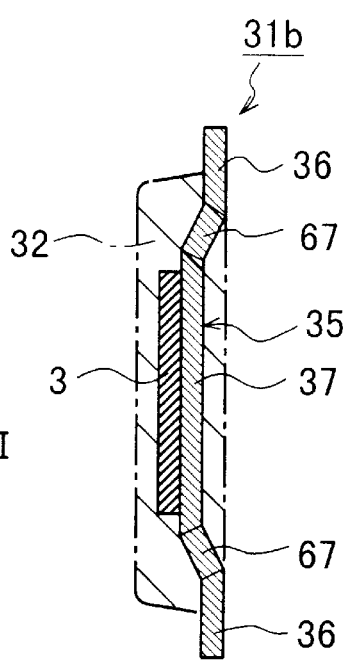
FIG. 35 is a cross-sectional view of the plastic-encapsulated semiconductor device according to the third embodiment, which is along the line XXXV—XXXV in FIG. 34.
Figure 36:
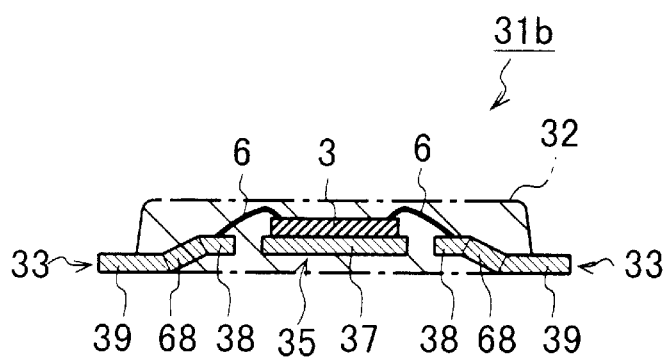
FIG. 36 is a cross-sectional view of the plastic-encapsulated semiconductor device according to the third embodiment, which is along the line XXXVI—XXXVI in FIG. 34.
Figure 37:
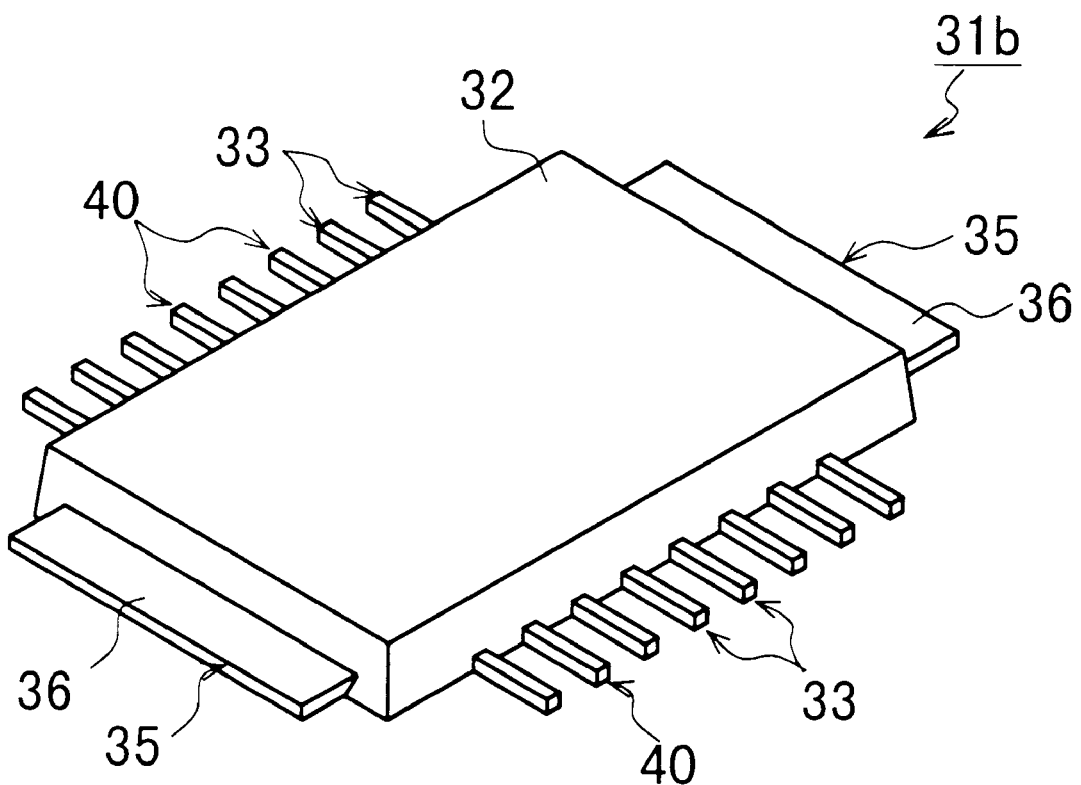
FIG. 37 is a perspective view of the plastic-encapsulated semiconductor device according to the third embodiment shown in FIG. 34, which shows the appearance.
Figure 38:
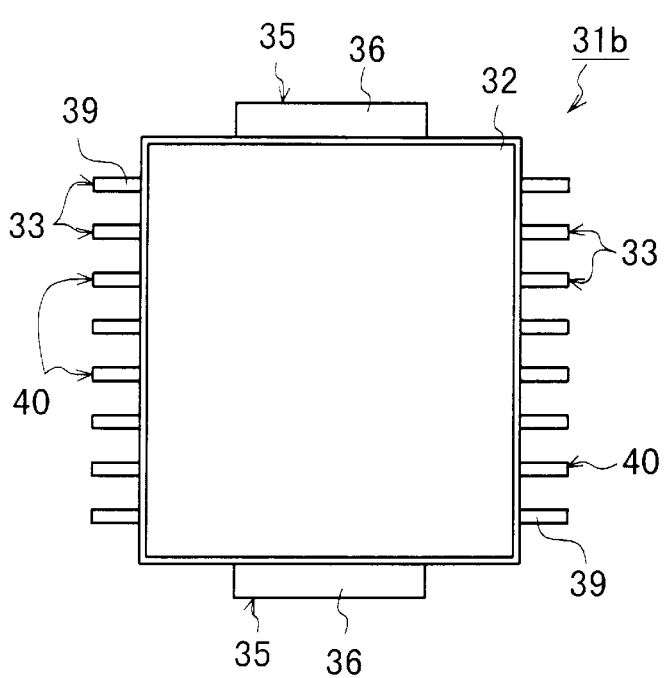
FIG. 38 is a plan view of the plastic-encapsulated semiconductor device according to the third embodiment shown in FIG. 34.
Figure 39:
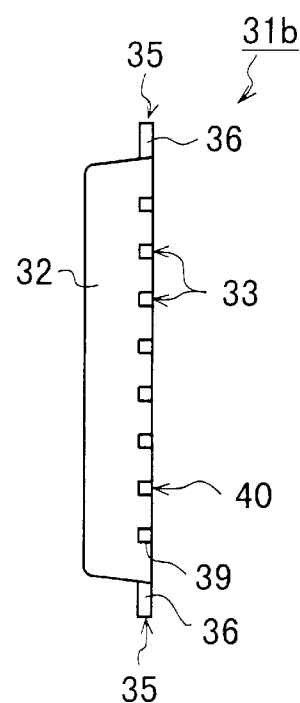
FIG. 39 is a side view of the plastic-encapsulated semiconductor device according to the third embodiment shown in FIG. 34.
Figure 40:
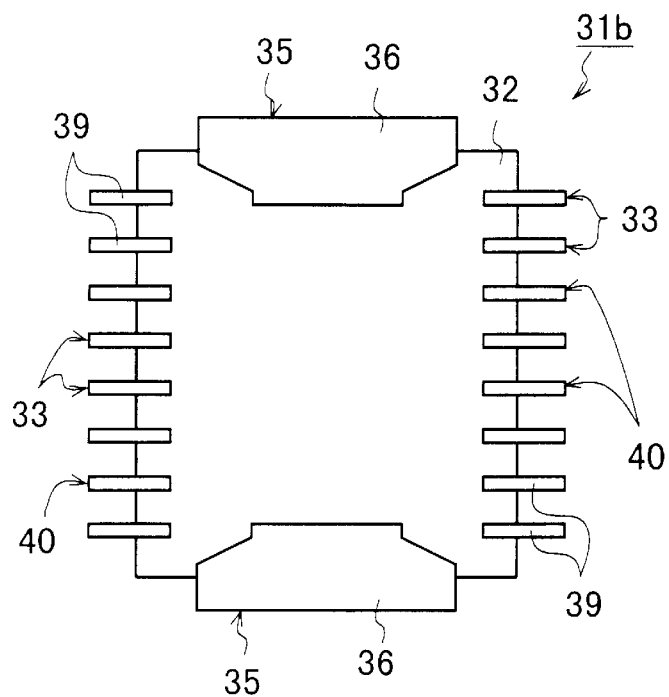
FIG. 40 is a bottom view of the plastic-encapsulated semiconductor device according to the third embodiment shown in FIG. 34.
Figure 41:
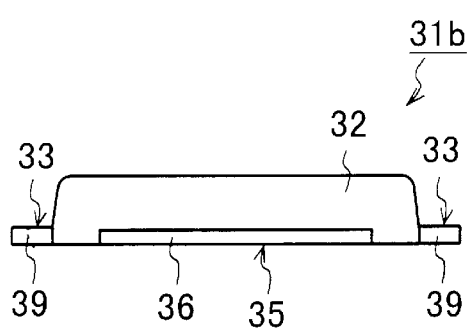
FIG. 41 is a front view of the plastic-encapsulated semiconductor device according to the third embodiment shown in FIG. 34.
Figure 42:
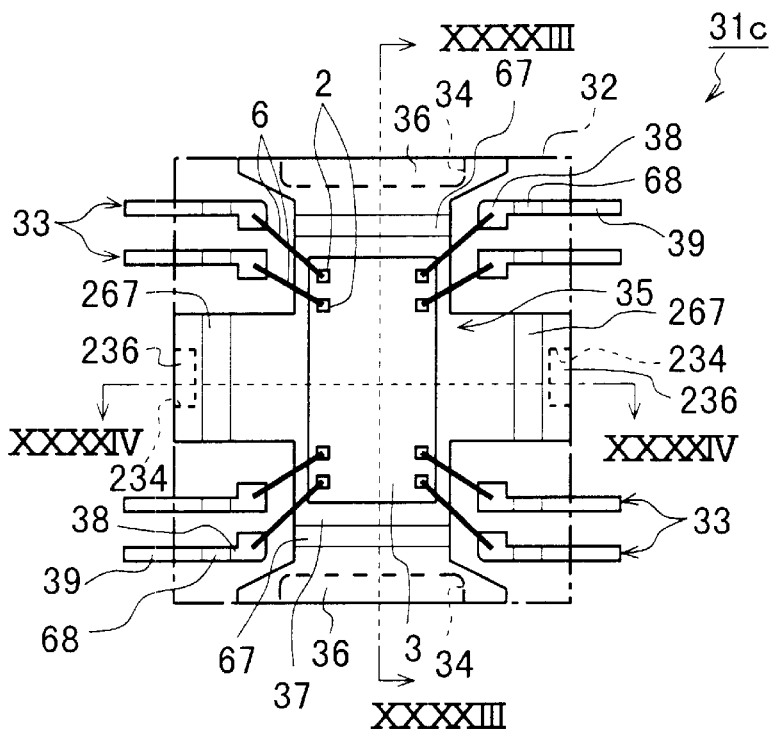
FIG. 42 is a plan view of a plastic-encapsulated semiconductor device according to a fourth embodiment of the present invention having grounding lead or terminals, which shows the inner configuration.
Figure 43:
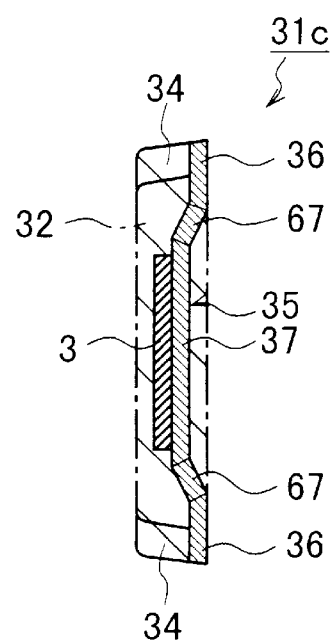
FIG. 43 is a cross-sectional view of the plastic-encapsulated semiconductor device according to the fourth embodiment, which is along the line XXXXIII—XXXXIII in FIG. 42.
Figure 44:
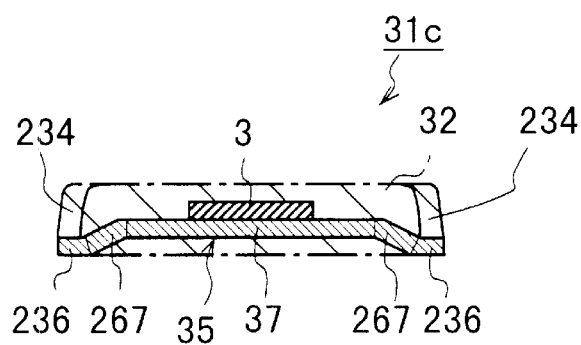
FIG. 44 is a cross-sectional view of the plastic-encapsulated semiconductor device according to the fourth embodiment, which is along the line XXXXVI—XXXXVI in FIG. 42.
Figure 45:
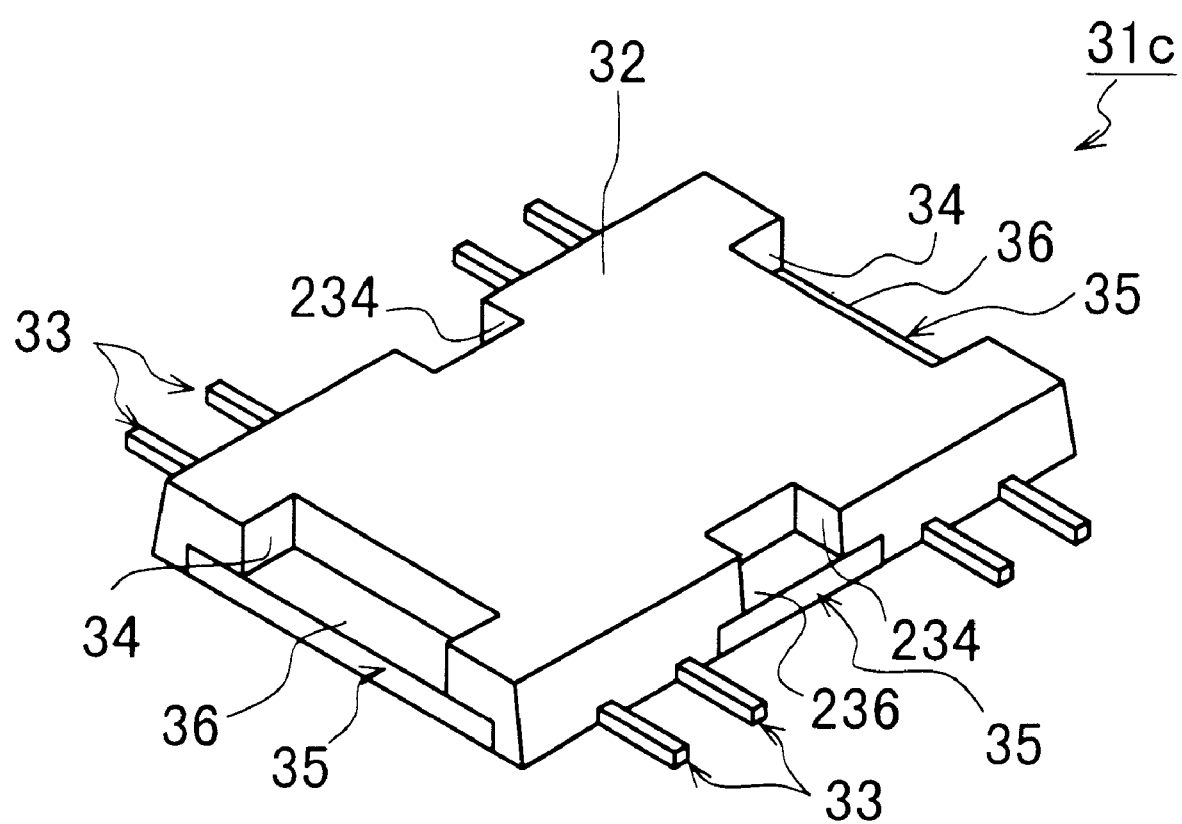
FIG. 45 is a perspective view of the plastic-encapsulated semiconductor device according to the fourth embodiment shown in FIG. 42, which shows the appearance.
Figure 46:
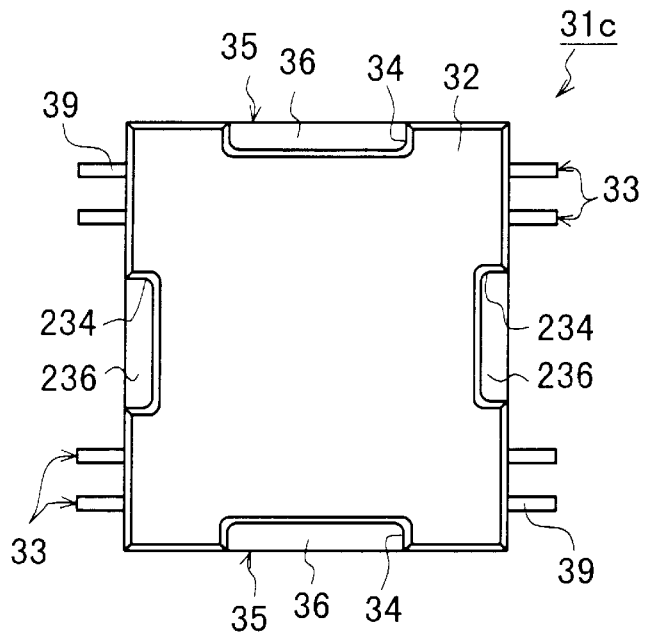
FIG. 46 is a plan view of the plastic-encapsulated semiconductor device according to the fourth embodiment shown in FIG. 42.
Figure 47:
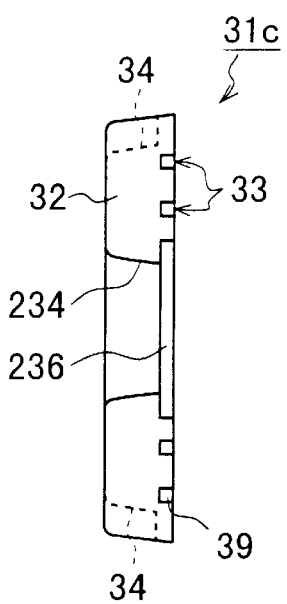
FIG. 47 is a side view of the plastic-encapsulated semiconductor device according to the fourth embodiment shown in FIG. 42.
Figure 48:
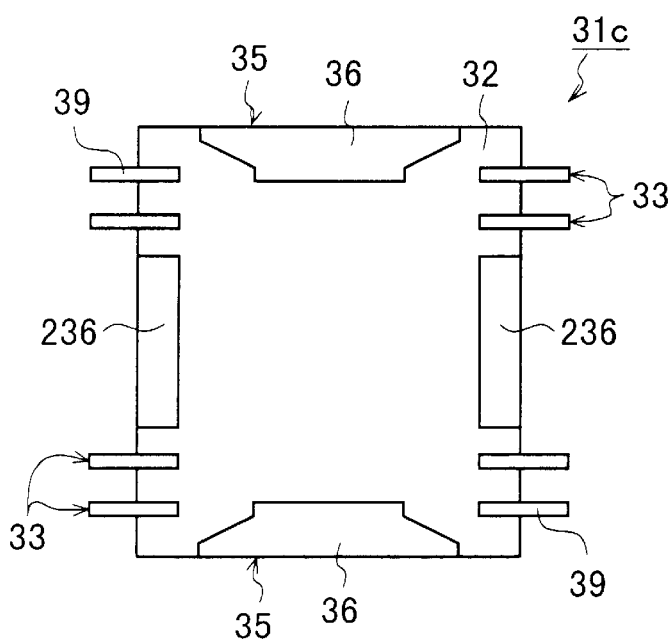
FIG. 48 is a bottom view of the plastic-encapsulated semiconductor device according to the fourth embodiment shown in FIG. 42.
Figure 49:
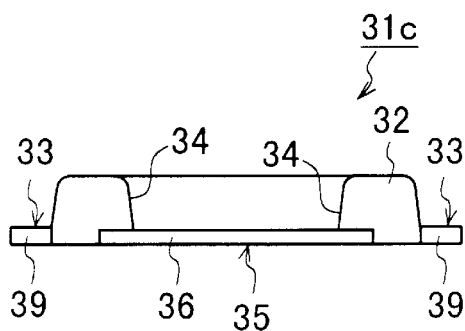
FIG. 49 is a front view of the plastic-encapsulated semiconductor device according to the fourth embodiment shown in FIG. 42.
Figure 50:
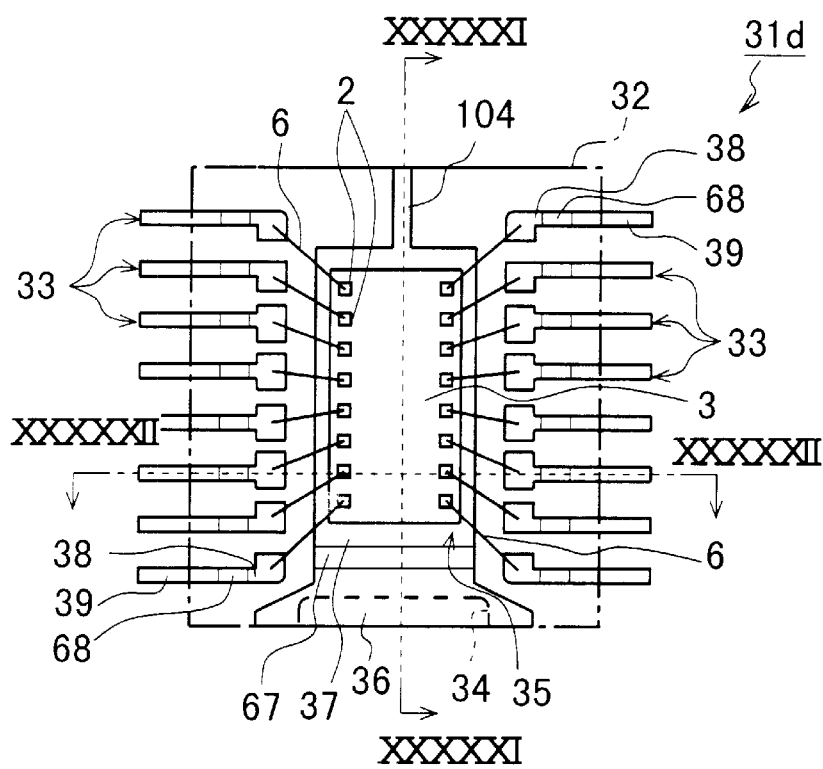
FIG. 50 is a plan view of a plastic-encapsulated semiconductor device according to a fifth embodiment of the present invention having grounding lead or terminals, which shows the inner configuration.
Figure 51:
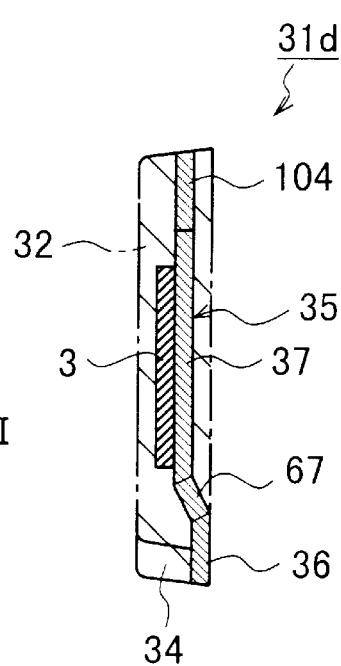
FIG. 51 is a cross-sectional view of the plastic-encapsulated semiconductor device according to the fifth embodiment, which is along the line XXXXXI—XXXXXI in FIG. 50.
Figure 52:
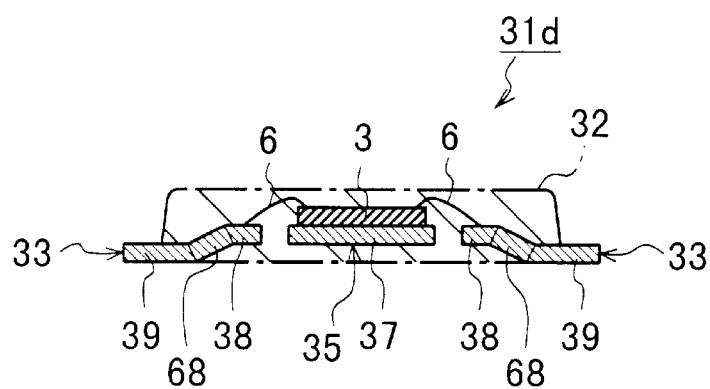
FIG. 52 is a cross-sectional view of the plastic-encapsulated semiconductor device according to the fifth embodiment, which is along the line XXXXXI—XXXXXI in FIG. 50.
Figure 53:
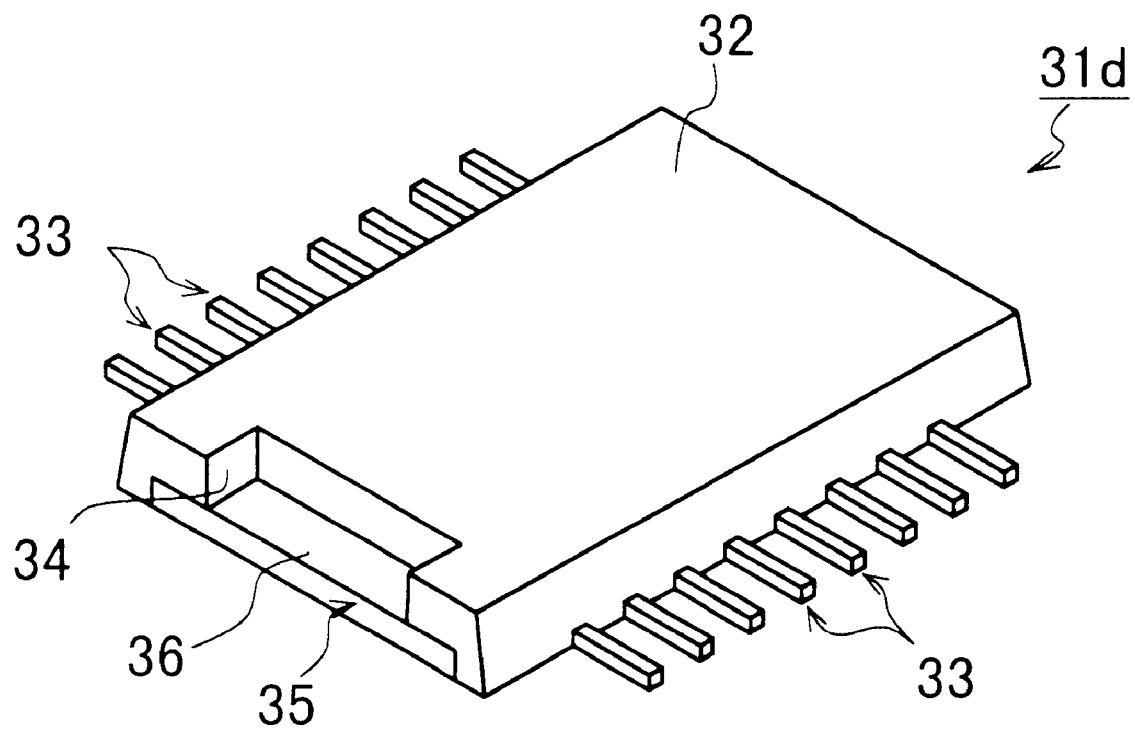
FIG. 53 is a perspective view of the plastic-encapsulated semiconductor device according to the fifth embodiment shown in FIG. 50, which shows the appearance.
Figure 54:
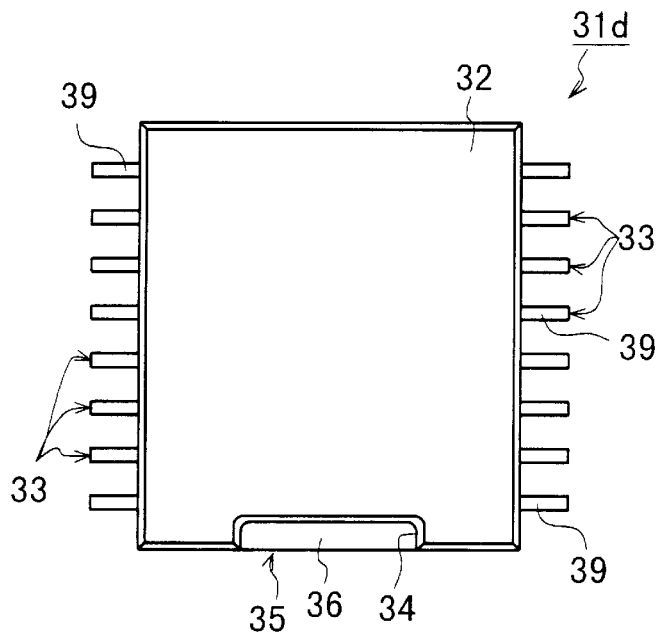
FIG. 54 is a plan view of the plastic-encapsulated semiconductor device according to the fifth embodiment shown in FIG. 50.
Figure 55:
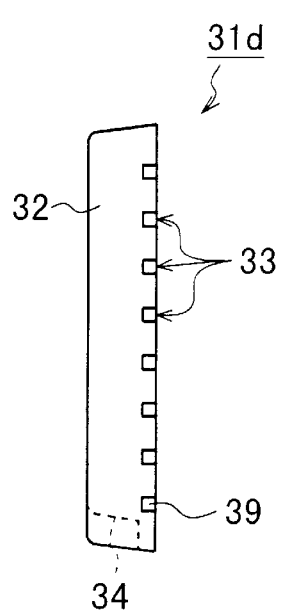
FIG. 55 is a side view of the plastic-encapsulated semiconductor device according to the fifth embodiment shown in FIG. 50.
Figure 56:
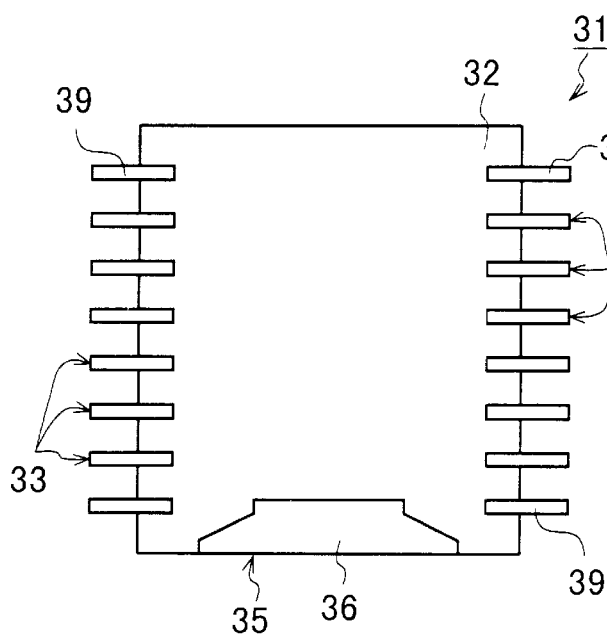
FIG. 56 is a bottom view of the plastic-encapsulated semiconductor device according to the fifth embodiment shown in FIG. 50.
Figure 57:
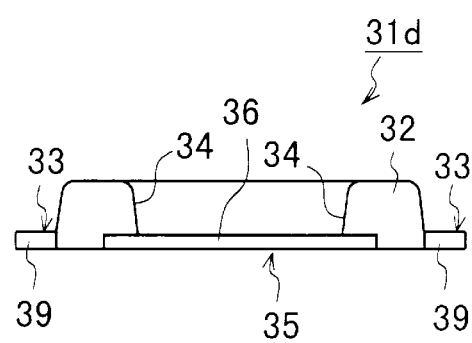
FIG. 57 is a front view of the plastic-encapsulated semiconductor device according to the fifth embodiment shown in FIG. 50.
Figure 58:
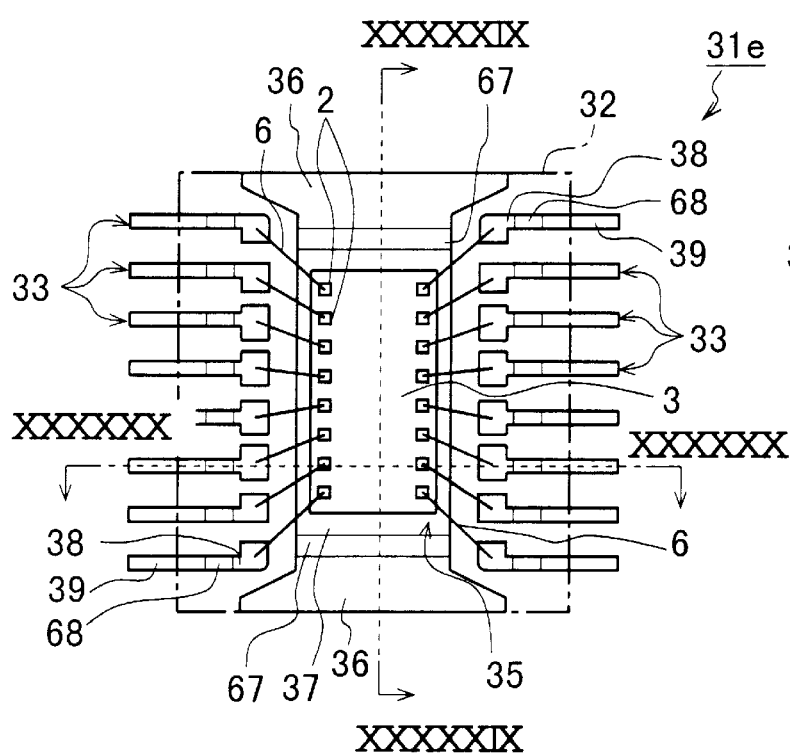
FIG. 58 is a plan view of a plastic-encapsulated semiconductor device according to a sixth embodiment of the present invention having grounding lead or terminals, which shows the inner configuration.
Figure 59:
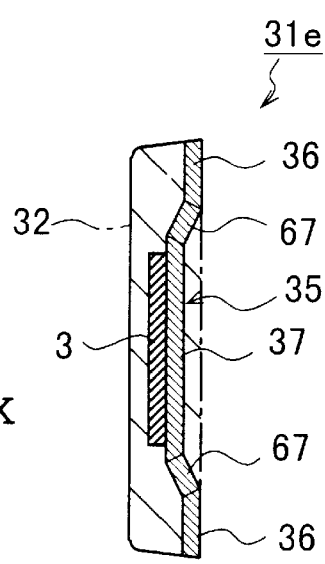
FIG. 59 is a cross-sectional view of the plastic-encapsulated semiconductor device according to the sixth embodiment,.which is along the line XXXXXXI—XXXXXXI in FIG. 58.
Figure 60:
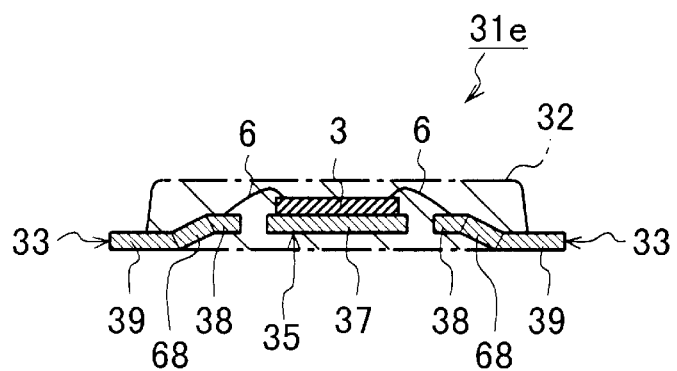
FIG. 60 is a cross-sectional view of the plastic-encapsulated semiconductor device according to the sixth embodiment, which is along the line XXXXXXII—XXXXXXII in FIG. 58.
Figure 61:
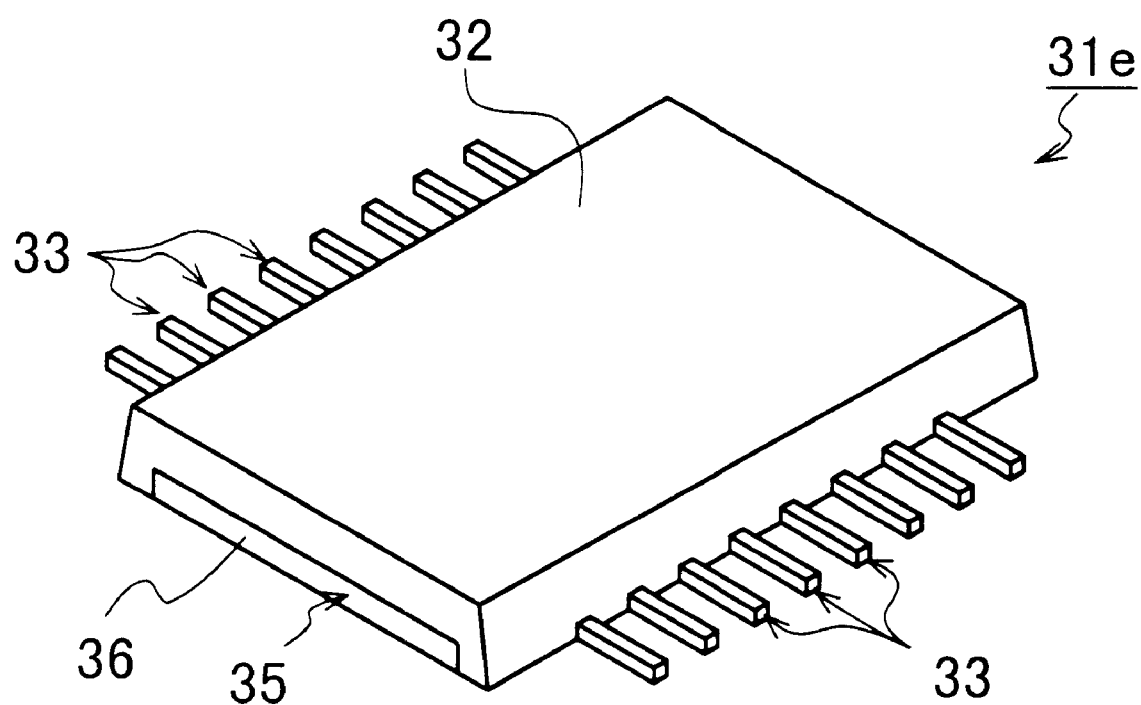
FIG. 61 is a perspective view of the plastic-encapsulated semiconductor device according to the sixth embodiment shown in FIG. 58, which shows the appearance.
Figure 62:
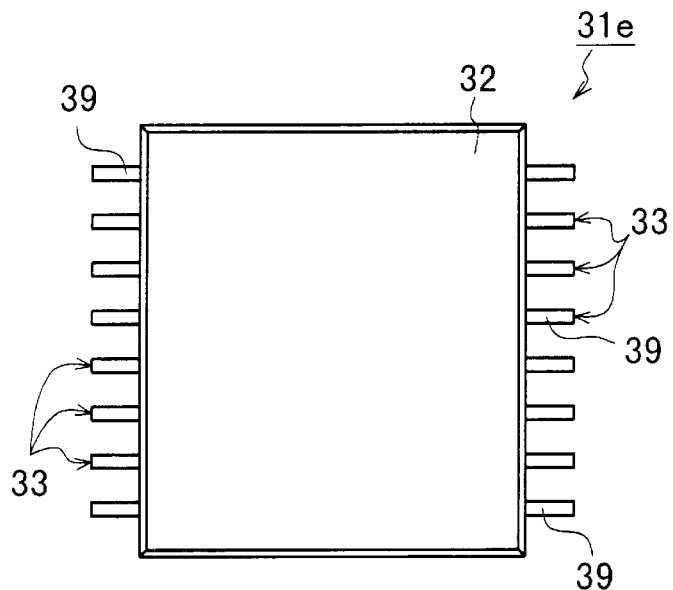
FIG. 62 is a plan view of the plastic-encapsulated semiconductor device according to the sixth embodiment shown in FIG. 58.
Figure 63:
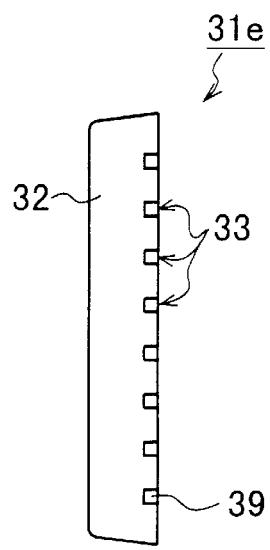
FIG. 63 is a side view of the plastic-encapsulated semiconductor device according to the sixth embodiment shown in FIG. 58.
Figure 64:
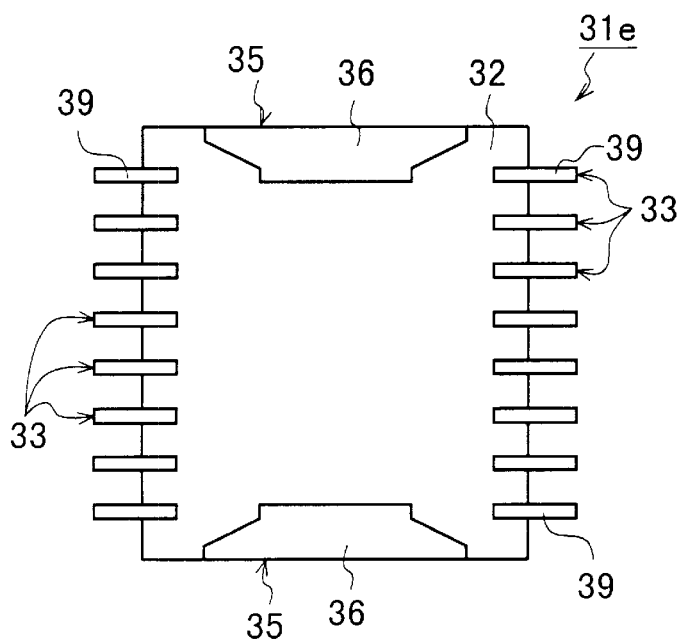
FIG. 64 is a bottom view of the plastic-encapsulated semiconductor device according to the sixth embodiment shown in FIG. 58.
Figure 65:
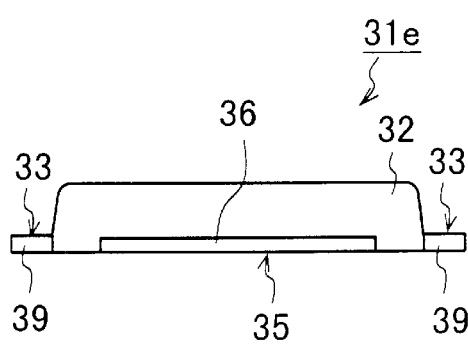
FIG. 65 is a front view of the plastic-encapsulated semiconductor device according to the sixth embodiment shown in FIG. 58.

FIG. 33 shows a plastic-encapsulated semiconductor device 31a according to a second embodiment.

The device 31a according to the second embodiment has a same configuration as the device 31 according to the first embodiment, except that grounding leads 40 are provided instead of the corresponding leads 33. Therefore, the explanation relating to the same configuration is omitted here by adding the same reference numerals to the same or corresponding elements in FIG. 33.

Thus, it is clear that the device 31a has the same advantages as those in the first embodiment.

Each of the grounding leads 40 is formed by a bonding part 38a, a terminal part 39a, and a connection part 68a between the parts 38a and 39a. The grounding leads 40, which are incorporated with the island 35, are bent at the connection parts 68a in the same way as the leads 33.

The incorporation of the grounding leads 40 with the island 35 enables a simple configuration and ensures the grounding connection.

On use, the grounding leads 40 and the end parts 37 of the island 35 are electrically connected to ground lines or an electricailly-conductive pattern of a wiring board. It is preferred that the grounding leads 40 are located to be adjacent to the leads 33 designed for high-frequency electric signals, because there is an additional advantage that electric isolation between the leads 33 and 40 is improved.

When the semiconductor device 31a according to the second embodiment is fabricated, the grounding leads 40 are formed in advance to be incorporated with the leadframe 102 together with the leads 33. In this case, the productivity is increased because a wire bonding process for the grounding leads 40 are not needed.

THIRD EMBODIMENT

FIGS. 34 to 41 show a plastic-encapsulated semiconductor device 31b according to a third embodiment.

The device 31b according to the third embodiment has a same configuration as the device 31a according to the second embodiment, except that the two end parts 36 of the island 35 are laterally protruded from the package 32 and the two depressions 34 of the plastic package 32 are canceled. Therefore, the explanation relating to the same configuration is omitted here by adding the same reference numerals to the same or corresponding elements in FIGS. 34 to 41.

Since the depressions 34 of the plastic package 32 are canceled, the heat-dissipation capability is lowered compared with the semiconductor devices 31 and 31a according to the first and second embodiments. However, the two ends parts 36 of the island 35 are protruded from the package 32, and as a result, the heat-dissipation capability is approximately equal to the semiconductor devices 31 and 31a according to the first and second embodiments.

There is a disadvantage that upsizing of the device 31b will occur due to the protruded ends parts 36 of the island 35 compared with the semiconductor devices 31 and 31a according to the first and second embodiments.

FOURTH EMBODIMENT

FIGS. 42 to 49 show a plastic-encapsulated semiconductor device 31c according to a fourth embodiment.

The device 31c according to the fourth embodiment has a same configuration as the device 31 according to the first embodiment, except that not only the two end parts 36 of the island 35 but also two side parts 236 of the island 35 are exposed from the package 32, and that two depressions 234 are added to the plastic package 32. Therefore, the explanation relating to the same configuration is omitted here by adding the same reference numerals to the same or corresponding elements in FIGS. 42 to 49.

The plan shape of the island 35 is like a cross. The two additional depressions 234 of the plastic package 32 are formed to expose the two side parts 236 of the island 35.

There is an additional advantage that the heat-dissipation capability is improved compared with the device 31 according to the first embodiment, together with the same advantages as those in the first embodiment.

There is a disadvantage that the maximum number of the leads 33 is decreased because of the additional depressions 234 of the plastic package 32 compared with the semiconductor devices 31, 31a, and 31b according to the first to third embodiments.

FIFTH EMBODIMENT

FIGS. 50 to 57 show a plastic-encapsulated semiconductor device 31d according to a fifth embodiment.

The device 31d according to the fifth embodiment has a same configuration as the device 31 according to the first embodiment, except that one of the two end parts 36 of the island 35 and one of the two depressions 34 of the plastic package 32 are canceled. Therefore, the explanation relating to the same configuration is omitted here by adding the same reference numerals to the same or corresponding elements in FIGS. 50 to 57.

Instead of the end part 36 of the island 35, a slender end part 104 is provided to be connected to the chip-mounting part 37 of the island 35.

There is approximately the same advantages as those in the first embodiment. However, the heat-dissipation capability is slightly degraded compared with the device 31 according to the first embodiment due to the cancellation of the end part 36 of the island 35 and the depression 34 of the plastic package 32.

SIXTH EMBODIMENT

FIGS. 58 to 65 show a plastic-encapsulated semiconductor device 31e according to a sixth embodiment.

The device 31e according to the sixth embodiment has a same configuration as the device 31 according to the first embodiment, except that the two depressions 34 of the plastic package 32 are canceled. Therefore, the explanation relating to the same configuration is omitted here by adding the same reference numerals to the same or corresponding elements in FIGS. 58 to 65.

There is an additional advantage that the molding dies 111 and 112 are simply and readily fabricated, because the plastic package 32 has a very simple shape.

However, the heat-dissipation capability is slightly degraded compared with the device 31 according to the first embodiment due to the cancellation of the two depressions 34 of the plastic package 32.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A plastic-encapsulated semiconductor device comprising:
   an electrically-conductive island having a chip-mounting area;
   an IC chip fixed on said chip-mounting area of said island;
   leads electrically connected to bonding pads of said chip through bonding wires;
   a plastic package for encapsulating said island, said chip, said bonding wires, and inner parts of said leads;
   said package having an approximately flat bottom face;
   outer parts of said leads protruding from said package and located in approximately a same plane as said bottom face of said package;
   said island having an exposition part contained within a periphery of said plastic package, said exposition part exposed from said package at a location excluding said chip-mounting area, wherein the exposed surface area of said exposition part is large enough to dissipate heat away from said plastic-encapsulated semiconductor device;
   a lower face of said exposition part of said island located in approximately a same plane as said bottom face of said package;
   said chip and said chip-mounting area of said island being entirely buried in said package; and
   a part of said island excluding said chip-mounting area being bent toward said bottom face of said package to be exposed therefrom.

2. A device as claimed in claim 1, further comprising an additional lead for grounding;
   wherein said additional lead is incorporated with said island.

3. A device as claimed in claim 1, wherein an upper face of said exposition part of said island is exposed from said package.

4. A device as claimed in claim 1, wherein said package has a depression formed to expose an upper face of said exposition part of said island from said package.

5. A device as claimed in claim 1, wherein said lower face of said exposition part of said island is wider than an exposed upper face of said exposition part of said island.

6. A device as claimed in claim 1, wherein said exposition part of said island is protrudes from said plastic package.

7. The plastic-encapsulated semiconductor device according to claim 1, wherein a width of said exposition part is at least half of a width of said plastic package.

8. The plastic encapsulated semiconductor device according to claim 4, wherein at least two depressions are formed in said plastic package to expose an upper face of said exposition part in two separate areas of the plastic-encapsulated semiconductor device.

9. The plastic encapsulated semiconductor device according to claim 4, wherein at least four depressions are formed in said plastic package to expose and upper face of said exposition part in four separate areas of the plastic-encapsulated semiconductor device.

10. A plastic-encapsulated semiconductor device comprising:
    an electrically-conductive island having a chip-mounting area and having end portions, each of said end portions including an upper surface and a lower surface;
    a chip fixed on said chip-mounting area;
    leads electrically connected said chip, said leads having inner parts and terminal parts;
    a plastic package for encapsulating said island, said chip and said inner parts of said leads;
    wherein an exposed surface of said terminal parts of said leads is substantially co-planar with a bottom of said package;
    wherein depressions formed in said plastic package at a peripheral location allow a surface area of said upper surface of each of said end portions to be exposed, such that heat generated in said plastic-encapsulated semiconductor device is dissipated via the exposed upper surface of said end portions;
    wherein an exposed said lower surface of each of said end portions is substantially co-planar with a bottom of said plastic package;
    and wherein said chip and said chip-mounting area of said electrically-conductive island are buried in said plastic package.

11. A device as claimed in claim 10, further comprising an additional lead for grounding attached to said island.

12. A device as claimed in claim 10, wherein an exposed surface of said lower face of each of said end portions is wider than an exposed surface of said upper face of each of said end portions.

13. A device as claimed in claim 10, wherein said end portions are protruded from said plastic package.

* * * * *